US 6,692,987 B2

(12) United States Patent
Lim et al.

(10) Patent No.: US 6,692,987 B2
(45) Date of Patent: Feb. 17, 2004

(54) BOC BGA PACKAGE FOR DIE WITH I-SHAPED BOND PAD LAYOUT

(75) Inventors: Thiam Chye Lim, Singapore (SG); Kay Kit Tan, Singapore (SG); Kian Chai Lee, Singapore (SG); Victor Cher Khng Tan, Singapore (SG); Kwang Hong Tan, Singapore (SG); Chong Pei Andrew Lim, Singapore (SG); Yong Kian Tan, Singapore (SG); Teck Kheng Lee, Singapore (SG); Sian Yong Khoo, Singapore (SG); Yoke Kuin Tang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/068,165

(22) Filed: Feb. 5, 2002

(65) Prior Publication Data
US 2003/0148557 A1 Aug. 7, 2003

(30) Foreign Application Priority Data

Dec. 12, 2001 (SG) ....................................... 2001-07789-0
Jan. 9, 2002 (SG) ....................................... 2002-00134-5

(51) Int. Cl.⁷ .......................... H01L 21/44; H01L 21/48; H01L 21/50
(52) U.S. Cl. ...................... 438/106; 438/123; 438/126; 438/127
(58) Field of Search .................. 257/667, 687, 257/778, 787; 264/272.11, 272.13–272.15, 272.17; 361/767; 425/89, 116, 123, 125, 544, 812; 438/106, 107, 109, 112, 118, 124, 126, 127, 613, 669, 675

(56) References Cited

U.S. PATENT DOCUMENTS

| 5,254,501 | A | * | 10/1993 | Tung et al. .................... 29/827 |
| 5,461,255 | A | * | 10/1995 | Chan et al. ................. 257/672 |
| 6,048,755 | A | | 4/2000 | Jiang et al. ................. 438/118 |
| 6,122,171 | A | | 9/2000 | Akram et al. ................. 361/704 |
| 6,173,490 | B1 | | 1/2001 | Lee et al. ....................... 29/841 |
| 6,177,723 | B1 | | 1/2001 | Eng et al. .................... 257/691 |
| 6,184,465 | B1 | | 2/2001 | Corisis ........................ 174/52.4 |
| 6,210,992 | B1 | | 4/2001 | Tandy et al. ................. 438/106 |
| 6,229,204 | B1 | | 5/2001 | Hembree ..................... 257/675 |
| 6,268,650 | B1 | | 7/2001 | Kinsman et al. ............. 257/691 |
| 6,284,569 | B1 | | 9/2001 | Sheppard et al. ........... 438/110 |
| 6,287,503 | B1 | | 9/2001 | Thummel ............... 264/272.13 |
| 6,294,825 | B1 | | 9/2001 | Bolken et al. .............. 257/676 |
| 6,439,869 | B1 | | 8/2002 | Seng et al. ..................... 425/89 |
| 6,469,399 | B2 | * | 10/2002 | Fang et al. .................. 257/797 |
| 6,486,536 | B1 | | 11/2002 | Chye et al. .................. 257/667 |
| 2002/0072153 | A1 | | 6/2002 | Lee et al. .................... 438/124 |
| 2002/0172024 | A1 | | 11/2002 | Hui et al. .................... 361/767 |
| 2003/0042617 | A1 | | 3/2003 | Lee ............................. 257/778 |

* cited by examiner

Primary Examiner—Kamand Cuneo
Assistant Examiner—Asok Kumar Sarkar
(74) Attorney, Agent, or Firm—Whyte Hirschboeck Dudek SC

(57) ABSTRACT

Semiconductor die units for forming BOC BGA packages, methods of encapsulating a semiconductor die unit, a mold for use in the method, and resulting encapsulated packages are provided. In particular, the invention provides a semiconductor die unit comprising an integrated circuit die with a plurality of bond pads in an I-shaped layout and an overlying support substrate having an I-shaped wire bond slot.

74 Claims, 16 Drawing Sheets

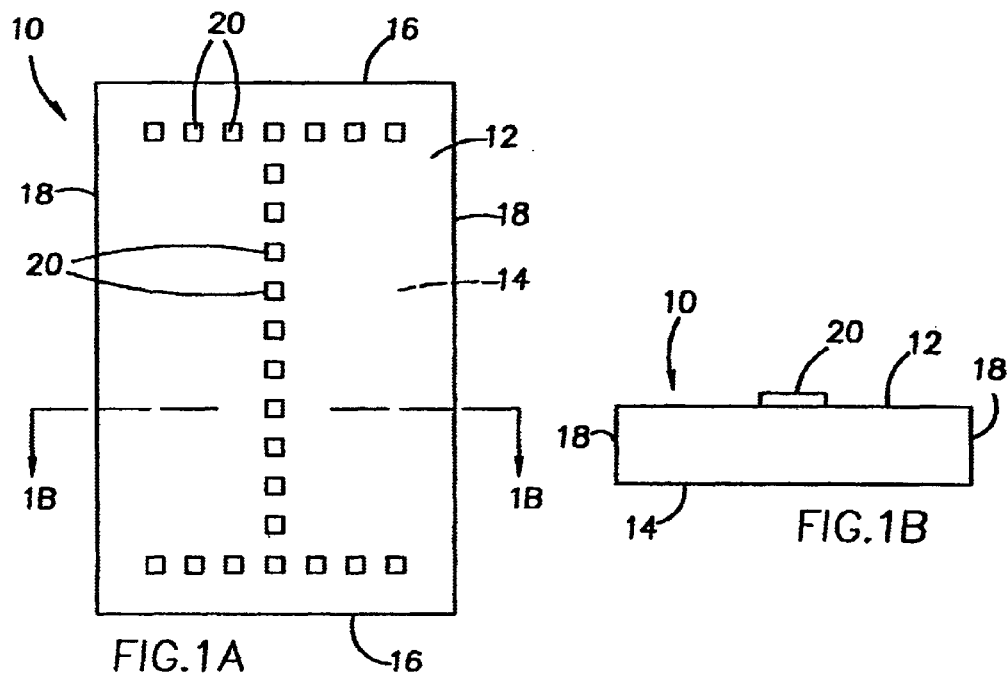
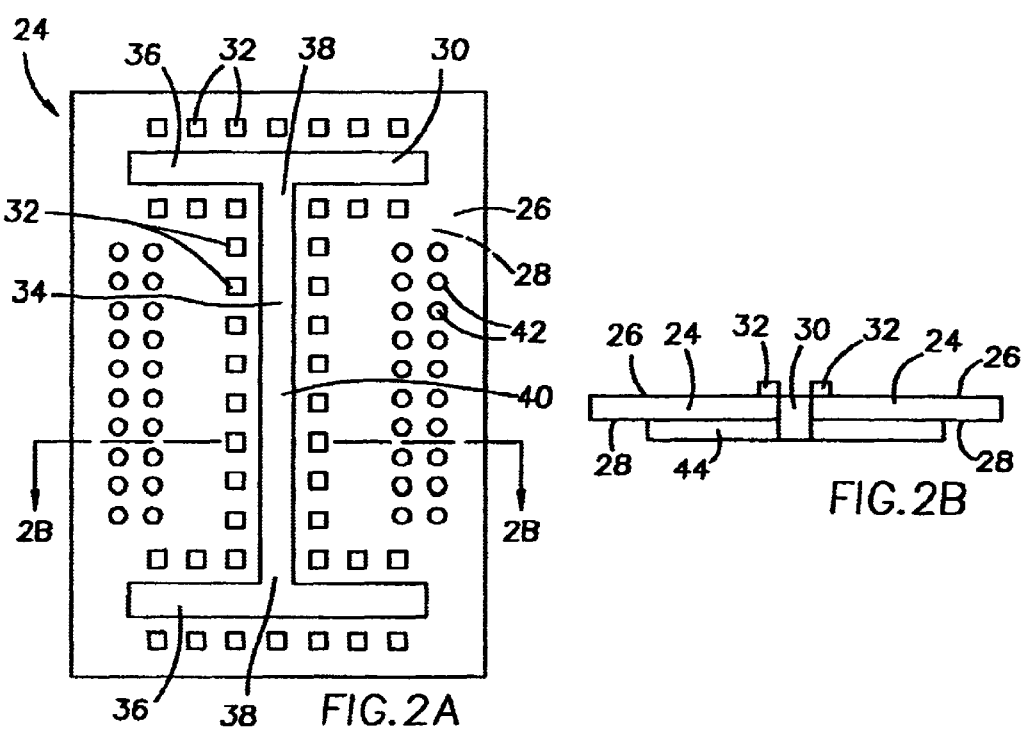

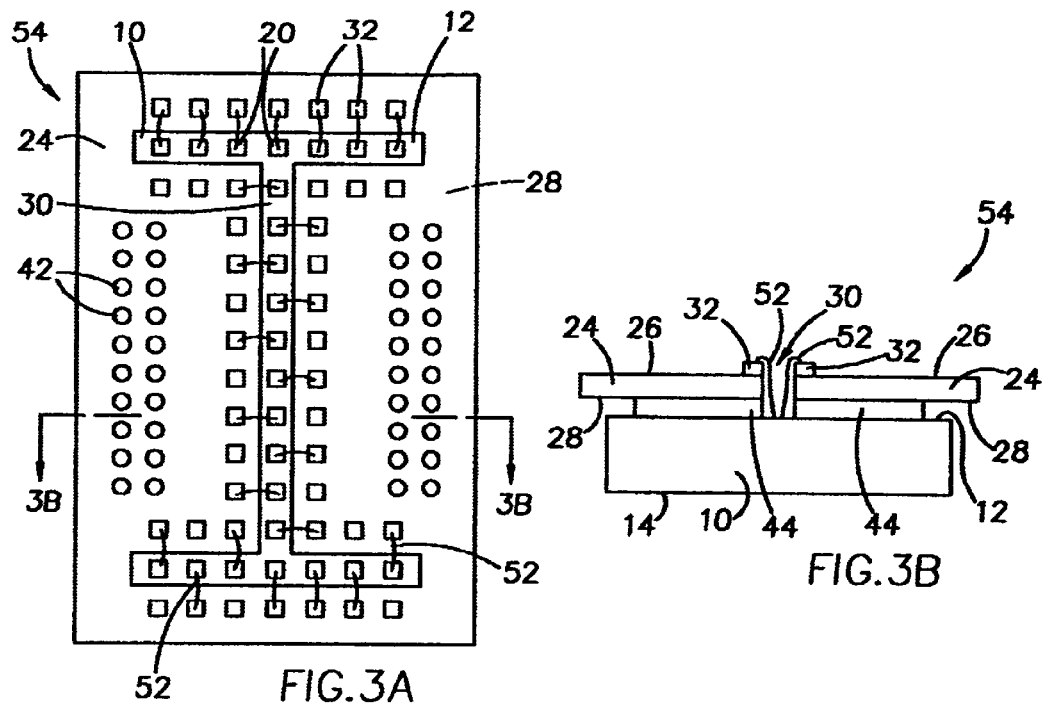
FIG. 3A
FIG. 3B
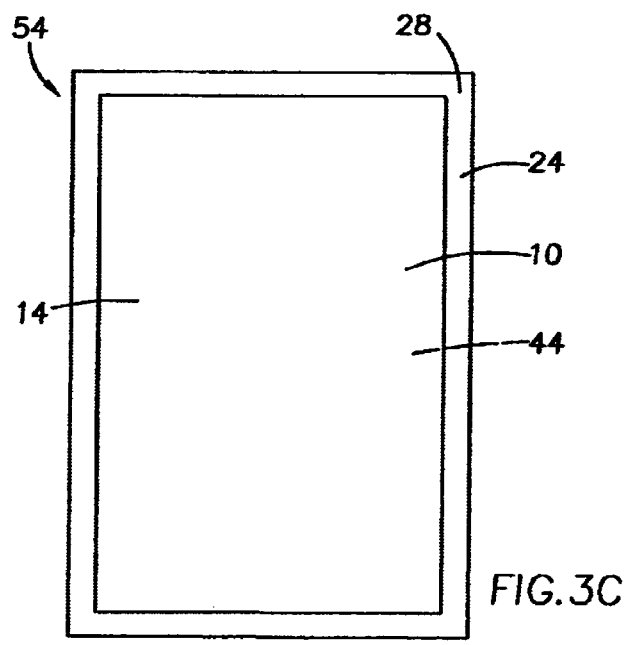
FIG. 3C

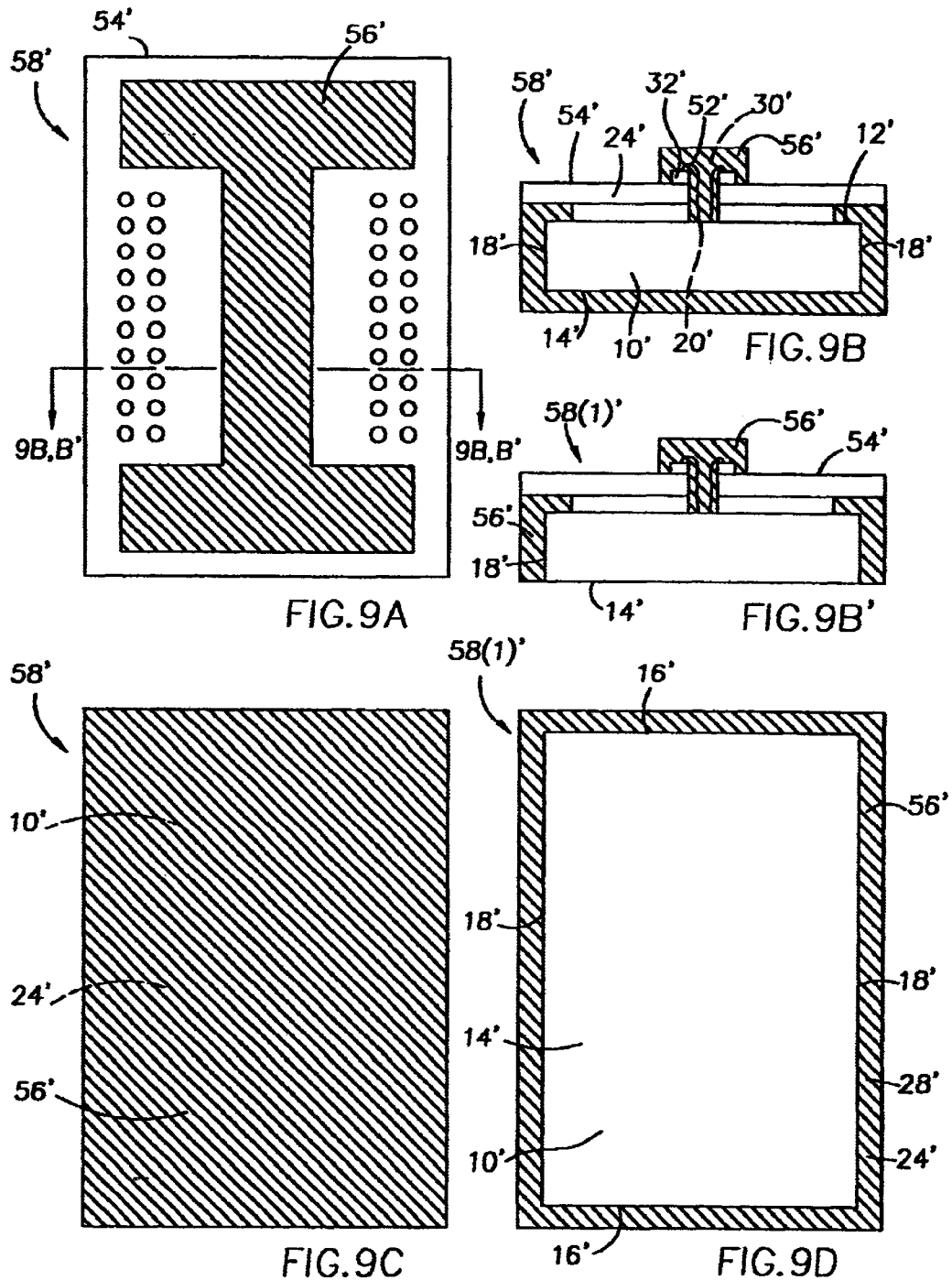

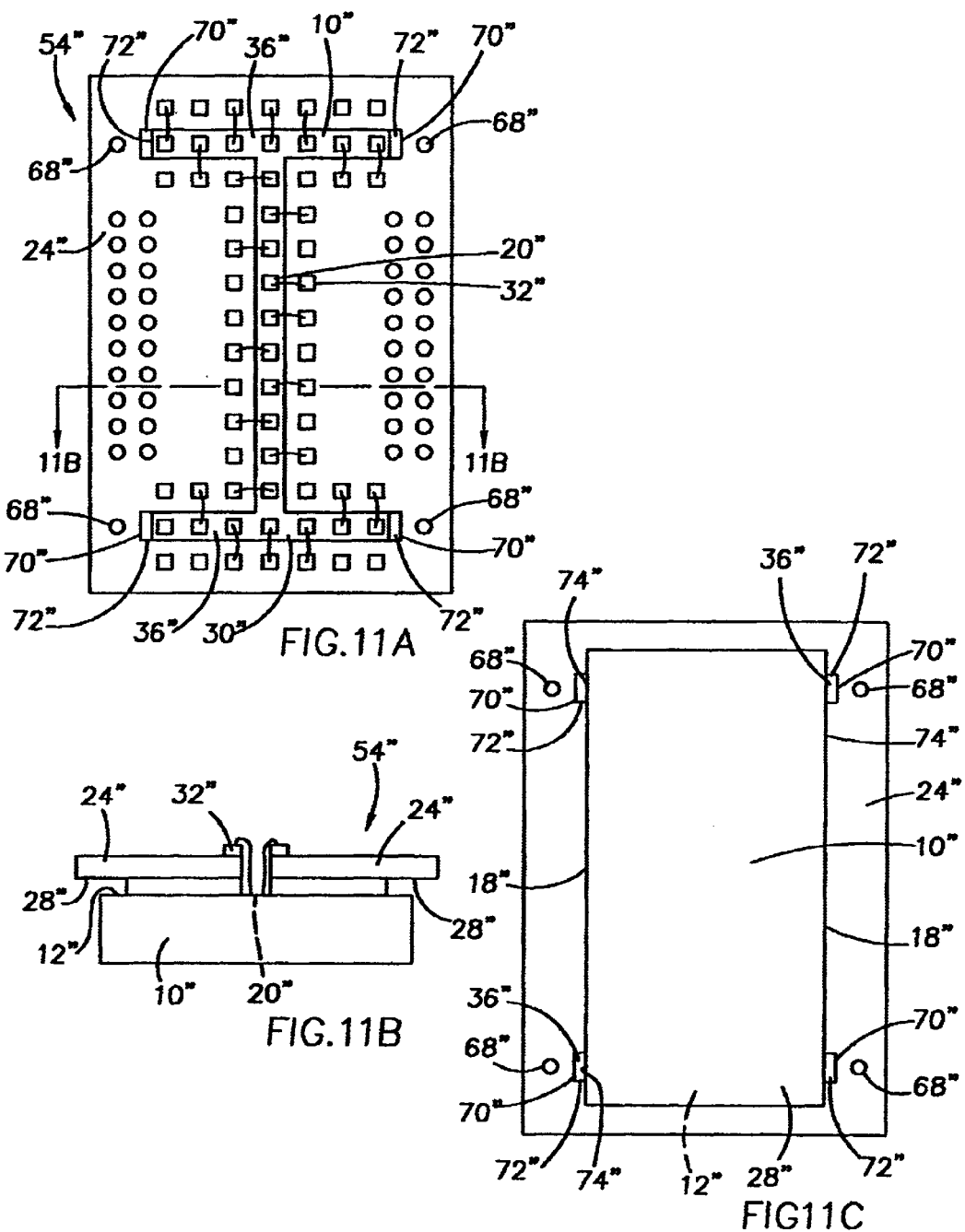

BOC BGA PACKAGE FOR DIE WITH I-SHAPED BOND PAD LAYOUT

FIELD OF THE INVENTION

The present invention relates generally to packaging electronic components, and particularly to methods of encapsulating board-on-chip (BOC) ball grid array (BGA) integrated circuit die units, and particularly to die units with non-standard bond pad layouts including an I-shaped bond pad layout.

BACKGROUND OF THE INVENTION

Integrated circuit (IC) chips are enclosed in plastic packages that provide protecting against damage and environmental contaminants, and enable electrical of the chip to other circuits on a printed circuit board. Packaging IC chips has involved the placement of a chip on a flexible board where following adhesion of the chip to the board and wire bonding to connect the leads from the chip to the terminals on the board, an encapsulant is flowed over the chip and board to form a sealed package.

Plastic encapsulation of semiconductor devices by transfer molding is a conventionally used technique. Typically, a pre-encapsulated die unit is placed in a mold having top and bottom cavity molding plates. The lower molding plate has a constricted channel or mold gate along one side of the plate, and the encapsulation material, typically a thermoplastic or thermosetting material, enters through the mold gate and flows under and then over the IC chip to cover the electrical leads. The mold gate limits the flow rate and injection velocity of a molding compound into the cavity. The encapsulation material is then cured to harden it. In devices having a ball grid array (BGA) on one side of the substrate, the molding process is conducted so that the ball grid array connections are not covered by the molding compound during the encapsulation process.

The assembly process flows of standard BOC BGA packaging techniques are set-up for conventional IC chips having a bond pad layout arranged in a column down the center of the chip. Such packaging techniques cannot accommodate the assembly of die packages that do not utilize a standard wire bond slot and bond pad layout.

Currently, a semiconductor chip having a non-standard bond pad layout is packaged in a chip-on-board (COB) ball grid array (BGA) package. A disadvantage in using a COB BGA packaging technique is the use of long wires for connecting the bond pads in the center of the die to contacts on the underlying substrate, which are prone to damage. Another drawback is the resulting larger package size, which is needed to allow sufficient space for the wire bond connections.

In view of these and other deficiencies in conventional methods for fabricating BGA packages, improvements in fabrication methods for BOC BGA packages are needed.

SUMMARY OF THE INVENTION

The present invention provides semiconductor assemblies for forming BOC BGA packages, methods of encapsulating a semiconductor die unit, a mold assembly for use in the method, and resulting encapsulated die packages. In particular, the invention provides a semiconductor die unit comprising an integrated circuit die with a plurality of bond pads in an I-shaped layout and an overlying support substrate having an I-shaped wire bond slot.

In one aspect, the invention provides a method of encapsulating an integrated circuit die unit. In one embodiment, the method comprises providing a mold containing a die unit; the mold having first and second molding plates, a molding chamber, and a mold gate through the first molding plate providing a conduit for flowing a molding compound into the chamber, the mold gate oriented perpendicular to the second molding plate; the die unit comprising a die mounted onto a support substrate, the die having a first surface, a second surface, and sides, the first surface of the die comprising a plurality of bond pads formed thereon, and mounted onto the support substrate with the bond pads exposed through an opening of the support substrate; the die unit positioned within the mold such that the mold gate is oriented perpendicular to the opening in the support substrate of the die unit; and introducing a molding compound through the mold gate to flow the molding compound into the opening in the support substrate of the die unit to enclose the bond pads on the die.

In another embodiment, the method comprises providing a mold having a molding chamber and a mold gate providing a conduit for introducing a molding compound into the chamber; providing a die unit comprising a die having a first (active) surface, a second (inactive) surface, and sides, with the first surface of the die having electrical elements and a plurality of bond pads disposed thereon, the die mounted onto a support substrate with the bond pads exposed through an opening of the support substrate; placing the die unit in the mold with the mold gate oriented perpendicular to the first surface of the die; and introducing a molding compound through the mold gate whereby the molding compound flows into the opening in the support substrate to enclose the electrical elements and bond pads on the die.

In another embodiment of the method, the molding compound can be flowed onto the sides of the die and, optionally, onto the second (inactive) surface of the die, for example, through a gap or hole in the substrate of the die unit. In another embodiment of the method, the molding compound can be delivered through the mold gate onto a die unit at various positions along the wire bond slot, for example, at or near one end of the wire bond slot to about the center of the slot, and the compound flowed to fill the opening. In other embodiments of the method, the molding compound can be delivered into the mold chamber and into the wire bond slot opening in a downward or in an upward direction, for example, by orienting the mold gate and die unit relative to each other to achieve the desired upward or downward flow. In yet another embodiment, the method can be used for encapsulating a BOC BGA die unit having a wire bond slot and a plurality of bond pads in an I-shaped configuration or other non-standard layout.

In another embodiment, the method comprises the steps of: providing a die comprising a first surface, a second surface, and opposing sides, the first surface having electrical elements and a plurality of bond pads disposed thereon in an I-shaped layout; mounting the die onto a support substrate with the bond pads exposed through an I-shaped wire bond slot of the support substrate; electrically connecting the bond pads through the opening to bond pad fingers mounted on the support substrate adjacent to the opening to form a pre-encapsulated die unit; providing a mold having a molding chamber and a mold gate providing a conduit for introducing a molding compound into the chamber; placing the die unit in the mold with the mold gate oriented perpendicular to the opening of the support substrate of the die unit; and introducing a molding compound through the mold gate to flow the molding compound into the opening of the support substrate to enclose the electrical elements and bond pads on the first surface of the die. In another embodiment, the die is mounted onto the support substrate to provide a gap between a peripheral edge of the die and the opening of the support substrate; and in the step of introducing the molding compound, the molding compound flows through the gap and onto at least the sides of the die. In yet another embodiment, the support substrate includes holes therethrough adjacent to the gaps, and the die is mounted onto the support substrate such that the holes through the support substrate are uncovered, and the molding compound is flowed through the gap and the holes in the substrate to cover at least the sides of the die.

In another aspect, the invention provides a mold for encapsulating a semiconductor die. In one embodiment, the mold comprises first and second molding plates, a chamber, and a mold gate providing a conduit for introducing a molding compound into the chamber, with the mold gate oriented in a first molding plate to deliver a molding compound into the chamber perpendicularly into a wire bond slot of a die unit positioned between the two plates of the mold. The mold gate in the first molding plate is oriented perpendicular to the second molding plate, and perpendicular to the wire bond slot of the support substrate of the die unit positioned in the mold. The mold gate can positioned as desired within a molding plate to deliver the molding compound onto a die unit at or near one end of the wire bond slot to about the center of the slot, and the molding compound flowed to fill the opening. The mold gate and die unit can also be oriented to deliver the molding compound into the mold chamber in a downward or an upward direction into the wire bond slot opening. The mold can be structured to inhibit or allow flowing of the molding compound onto the sides and, optionally, the second (inactive) surface of the die.

In another aspect, the invention provides a semiconductor assembly. In one embodiment, the assembly comprises a board-on-chip (BOC) ball grid array (BGA) die unit having a die with a plurality of bond pads in an I-shaped layout exposed through an I-shaped wire bond slot of an overlying support substrate. The die unit can further include an adhesive layer interposed between the die and the support substrate, for example, an adhesive sheet having an I-shaped opening corresponding to the opening of the support substrate, or a pair of adhesive strips positioned on opposite sides and adjacent to the I-shaped opening.

In another embodiment, the die unit can include a feature such as a gap or a hole through which a molding compound can flow onto the sides of the die and, optionally, onto the inactive surface of the die, when the die unit is placed into a mold for encapsulation. In one example, the support substrate (and die) can be dimensioned (and configured) such that mounting the die onto the support substrate provides a gap between a peripheral edge of the die and the wire bond slot of the support substrate. In another example, a hole can be provided adjacent the wire bond slot to provide an opening through the support substrate. The die unit can be partially encapsulated with only the active surface of the die and, optionally, the sides of the die encapsulated with a molding compound, and the inactive surface of the die exposed. The die unit can also be completely overmolded by a molding compound.

The invention advantageously provides a BOC BGA package for IC dies and chips having an I-shaped bond pad configuration or other non-standard layout, and an assembly process to build such a package. The present BOC BGA semiconductor package is easier to assembly than COB BGA packages, particularly in terms of wire bonding and molding processes, and achieves a smaller package size with improved electrical performance due to shorter wire lengths. In addition, the BOC BGA packaging maintains a conventional solder ball grid array to facilitate its use in conventional semiconductor assemblies. The present invention can be applied to both single-in-line strip (SIS) BOC configurations in which the arrangement of units within the strip is limited to a single row, and matrix BOC configurations in which the strip configuration is in an array form and the arrangement of units is not limited to a single row.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 1A is a top plan view of an embodiment of an integrated circuit die having bond pads in an I-shaped layout for fabricating an encapsulated board on chip (BOC) die unit according to an embodiment of a method of the invention.

FIG. 1B is a side elevational view of the integrated circuit die of FIG. 1A taken along line 1B—1B.

FIG. 2A is top plan view of an embodiment of a support substrate having an I-shaped opening for use with the integrated circuit die of FIG. 1A.

FIG. 2B is a side elevational view of the support substrate of FIG. 2A taken along line 2B—2B, showing an adhesive layer attached to the underside of the substrate.

FIG. 3A is a top plan view of a partially assembled die unit formed by mounting the integrated circuit die of FIG. 1A onto the underside of the support substrate of FIG. 2A.

FIG. 3B is a side elevational view of the die unit of FIG. 3A, taken along line 3B—3B. FIG. 3C is a bottom plan view of the die unit of FIG. 3A.

FIG. 9A is a top plan view of the die unit of FIG. 8A encapsulated (top molded) according to a method of the invention to form a die package.

FIG. 9B is a side elevational view of an embodiment of the encapsulated package of FIG. 9A taken along line 9B,B'—9B,B', and showing the die being fully overmolded. FIG. 9B' is a side elevational view of another embodiment of the encapsulated die package of FIG. 9A, also taken along line 9B,B'—9B,B', and showing the sides of the die being overmolded and the second surface of the die exposed.

FIG. 9C is a bottom plan view of the encapsulated package shown in FIGS. 9A–9B. FIG. 9D is a bottom plan view of the encapsulated package depicted in FIGS. 9A–9B'.

FIG. 11A is a top plan view of another embodiment of a die unit having a gap along the edge of the integrated circuit die and the wire bond slot of the support substrate, and openings through the support substrate.

FIG. 11B is a side elevational view of the die unit of FIG. 11A, taken along line 11B—11B.

FIG. 11C is a bottom plan view of the die unit of FIG. 11A.

FIG. 12B' is a side elevational view of another embodiment of the encapsulated package of FIG. 12A, also taken along line 12B,B'—12B,B', showing the sides and second surface of the die being overmolded.

FIG. 14A is a top plan view of a panel or strip of mold units for fabricating multiple die packages, each mold unit having a top mold gate. FIG. 14B is a side elevational view of a mold unit of FIG. 14A taken along line 14B—14B, showing a die unit within a mold having a top mold gate oriented for downward delivery of a molding compound onto the die unit and flow of the molding compound around the die. FIG. 14C is a top plan view of the die unit of FIG. 14B with the upper molding plate removed, showing direction of flow of the molding compound. FIG. 14D is view of the resulting encapsulated die package within the mold. FIG. 14E is a top plan view of the encapsulated die package.

FIG. 16A is a side elevational view of the die unit within another embodiment of a mold having a top mold gate oriented for downward delivery of a molding compound onto the die unit and positioned at an end of a molding plate, showing flow of the molding compound around the die. FIG. 16B is a top plan view of the die unit of FIGS. 8A–8C within the mold of FIG. 16A, with the upper molding plate removed, showing direction of flow of the molding compound. FIG. 16B' is a top plan view of the die unit of FIG. 15A within the mold of FIG. 16A, with the upper molding plate removed and showing direction of flow of the molding compound.

DETAILED DESCRIPTION OF THE PREFERRED EMBODIMENTS

Figure 4:
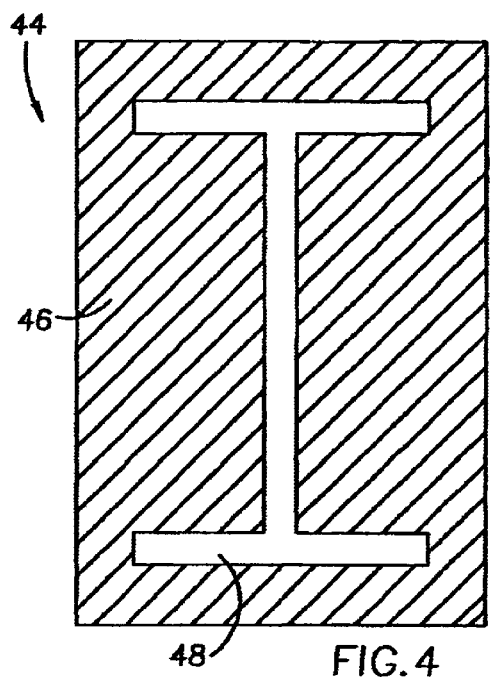
FIG. 4 is a top plan view of an embodiment of an adhesive layer for mounting the integrated circuit die of FIG. 1A onto the support substrate of FIG. 2A, the adhesive layer having an I-shaped opening.

The invention will be described generally with reference to the drawings for the purpose of illustrating the present preferred embodiments only and not for purposes of limiting the same. The figures illustrate processing steps for use in packaging semiconductor devices in accordance with the present invention. It should be readily apparent that the processing steps are only a portion of the entire fabrication process.

As used herein, the terms "top" and "bottom", "upper" and "lower", "side" and "end" are used for illustrative purposes only, and are not meant to limit the description of the invention in any way.

An embodiment of an encapsulated integrated circuit die package and method of fabricating the package according to the invention is described with reference to FIGS. 1–7, illustrating one-side encapsulation of the die.

As shown in FIGS. 1A–1B, an integrated circuit (semiconductor) die 10 is provided having a first (active) surface 12, a second (inactive) surface 14, and sides 16, 18. The first (active) surface 12 of the die 10 has electrical elements (circuitry) and a plurality of bond pads 20 formed thereon. In the illustrated example, the bond pads 20 are formed on the die 10 in an I-shaped layout. The first (active) surface 12 of the die is mounted onto a support substrate 24 such that the bond pads 20 are exposed through an opening (wire bond slot) 30 in the support substrate.

Referring to FIGS. 2A–2B, a support substrate 24 is provided having a first (upper) side 26, a second (under) side 28, and a wire bond slot or opening 30 that corresponds to the bond pad layout on the die 10. The support substrate 24 typically comprises an electrically insulating material such as an organic polymer resin reinforced with glass fibers. An exemplary BGA support substrate comprises a reinforced polymer laminate material such as bismaleimide triazine (BT) resins, or a polyimide resin. A typical thickness of the support substrate is about 0.2 mm to about 1.6 mm.

In the illustrated example, the support substrate 24 includes an I-shaped wire bond slot or opening 30 that corresponds to the bond pad layout on the die 10, through which wire bonding connects the bond pads 20 with contacts 32 on the upper side 26 of the support substrate 24. The I-shaped wire bond slot 30 has a main elongate segment 34 and a pair of shorter elongate segments 36 that are perpendicular to and on opposing ends 38 of the main elongate segment 34.

A plurality or series of bond pad fingers (contacts) 32 are formed on the first (upper) side 26 of the support substrate 24 adjacent to the edge or periphery 40 of the wire bond slot 30. The bond pad fingers 32 comprise a conductive metal such as copper, aluminum, among others. A plurality of ball pads 42 comprising a conductive metal layer and shown in a series of two parallel rows, are formed on the first (upper) side 26 of the support substrate 24 adjacent to the bond pad fingers 32. The bond pad fingers are electrically connected to the ball pads 42 by traces (not shown) within the support substrate 24.

As shown in FIGS. 3A–3B, the first (active) surface 12 of the die 10 is mounted against the underside 28 of the support substrate 24, with the bond pads 20 exposed through the wire bond slot 30 in the support substrate 24. Any conventional affixation technique can be used. For example, the die 10 can be secured to the support substrate 24 with an adhesive such as epoxy, an adhesive tape, or other available technique. In a preferred example, a layer of adhesive tape 44 is interposed between the support substrate 24 and the die 10.

Figure 5:
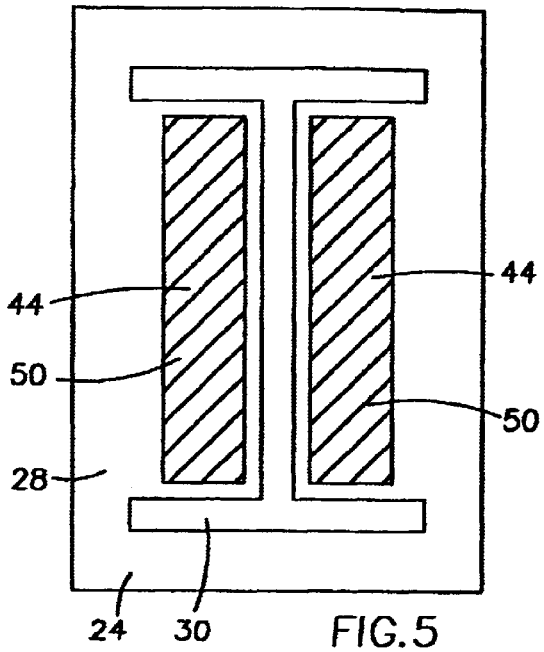
FIG. 5 is a bottom plan view of the support substrate of FIG. 2A with another embodiment of an adhesive layer in the form of adhesive strips for mounting the die of FIG. 1A onto the underside of the support substrate.

As shown in FIG. 4, in one embodiment, the adhesive layer 44 can comprise an adhesive sheet 46 having an I-shaped opening 48 that corresponds to the I-shaped wire bond slot 30 of the support substrate 24, and can be attached to the underside 28 of the support structure 24. In another embodiment as shown in FIG. 5, the adhesive layer 44 can comprise a pair of adhesive strips 50 that are positioned along opposite sides and adjacent to the I-shaped wire bond slot 30 on the underside 28 of the support substrate 24. The adhesive layer 44 is applied to the underside 28 of the support structure along the edge of the opening 30.

As further shown in FIGS. 3A–3B, bond wires 52 are connected from the bond pads 20 on the die 10 through the wire bond slot 30 to the bond pad fingers 32 on the first (upper) side 26 of the support substrate 24, resulting in a die-mounted and wire-bonded unit ("die unit") 54. The configuration of the illustrated die unit 54 is known as a board-on-chip (BOC), in which the integrated circuit die or chip 10 is attached to the second (under) side 28 of a support substrate 24.

Figure 6A:
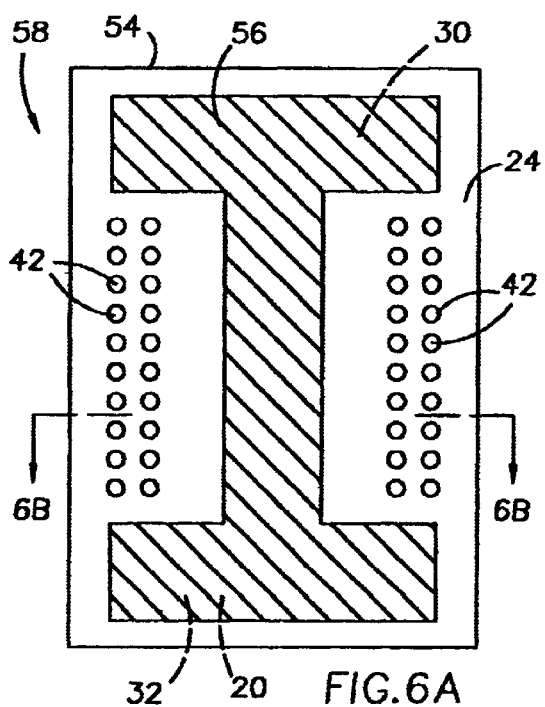
FIG. 6A is a top plan view of the die unit of FIG. 3A encapsulated (top molded) according to a method of the invention to form a package.
Figure 6B:
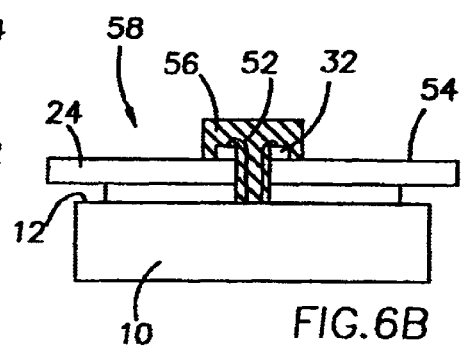
FIG. 6B is a side elevational view of the encapsulated package of FIG. 6A, taken along line 6B—6B.

Referring now to FIGS. 6A–6B, the BOC die unit 54 can be encapsulated with a molding compound 56 to pot the bond wires 52 and the bond pad fingers 32, and fill the wire bond slot 30 of the support substrate 24 to encapsulate the electronic components and the bond pads (20) on the first (active) surface 12 of the die 10, resulting in an encapsulated package 58. As depicted, the second (inactive) surface 12 of the die is exposed. The molding compound 56 is dried, set or cured to a solid phase. The molding compound is preferably a thermoset epoxy resin, for example, a novolac epoxy resin-based compound, that produces a rigid plastic body surrounding the die.

Figure 7A:
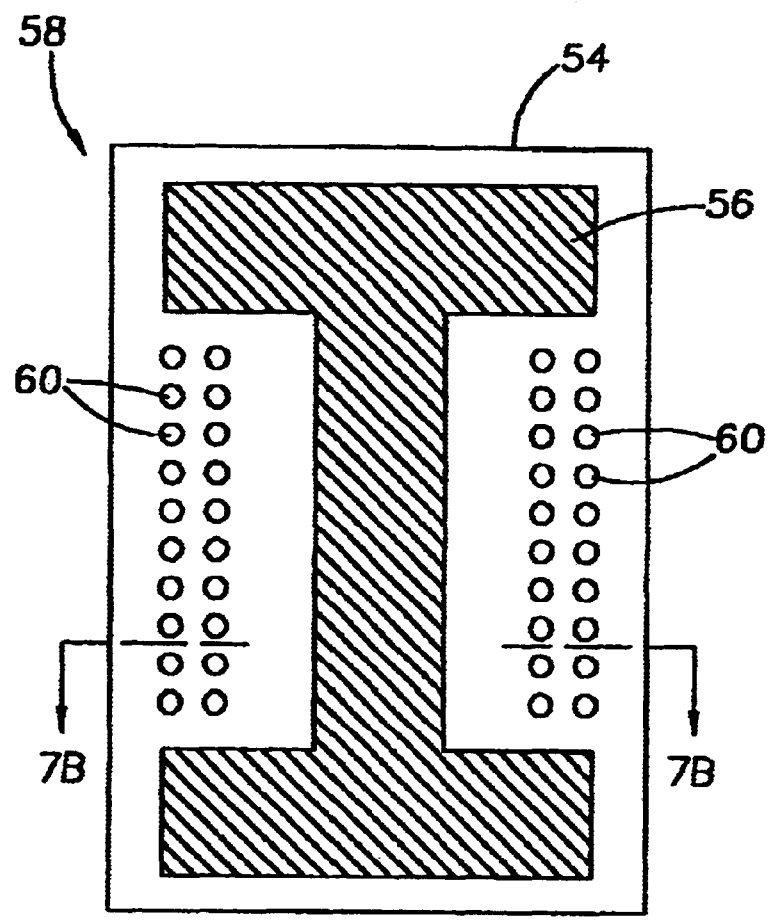
FIG. 7A is a top plan view of the encapsulated package of FIG. 6A, showing solder balls mounted thereon.
Figure 7B:
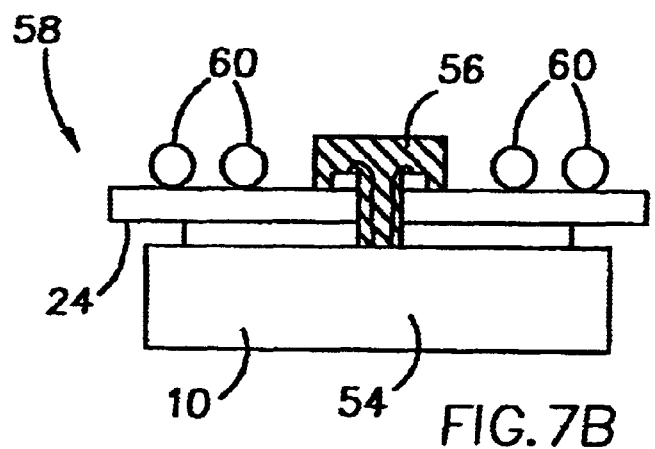
FIG. 7B is a side elevational view of the encapsulated package of FIG. 7A, taken along line 7B—7B.

Following the encapsulation, solder balls 60 can be conventionally bonded to the ball pads 42, as depicted in FIGS. 7A–7B. A solder reflow process can be used to bond the solder balls to the ball bond pads. The solder balls provide external electrical connections to the die, and permit the package to be surface mounted to a printed circuit board (PCB) or other electronic component.

Optionally, a heat sink (dissipater), for example, an extruded aluminum plate, a solder dam or ring, and other known devices (not shown), can be attached onto the die 10 to absorb and dissipate heat generated by electronic components. Heat sinks are known and used in the art, as described, for example, in U.S. Pat. No. 6,122,171 (Akram et al.).

In the foregoing embodiment, the molding compound 54 is disposed partially upon the support substrate 24 and partially upon the first (active) surface 12 of the die 10, with the second (inactive) surface 14 and sides 16, 18 of the die 10 exposed and not covered by the molding compound.

Another embodiment of an encapsulated die package 58' and method of the invention is illustrated in FIGS. 8–10. The die unit 54' is structured to allow the molding compound to flow onto the sides, and, if desirable, the second (inactive) surface of the die to encapsulate the sides and the second surface of the die.

Figure 8A:
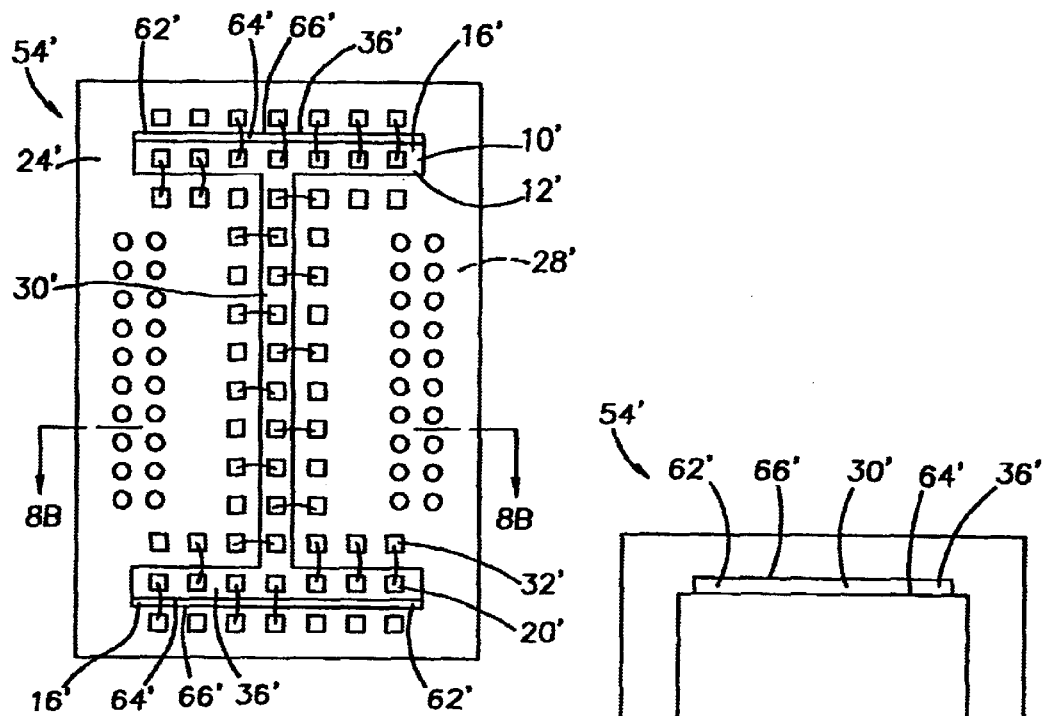
FIG. 8A is a top plan view of another embodiment of a die unit having a gap along the edge of the integrated circuit die and the wire bond slot of the support substrate.
Figure 8B:
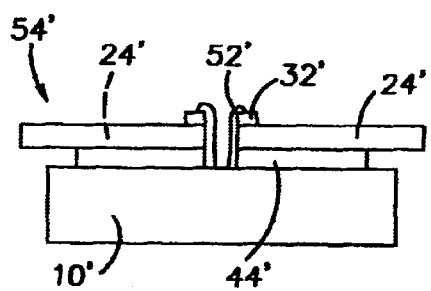
FIG. 8B is a side elevational view of the die unit of FIG. 8A, taken along line 8B—8B.
Figure 8C:
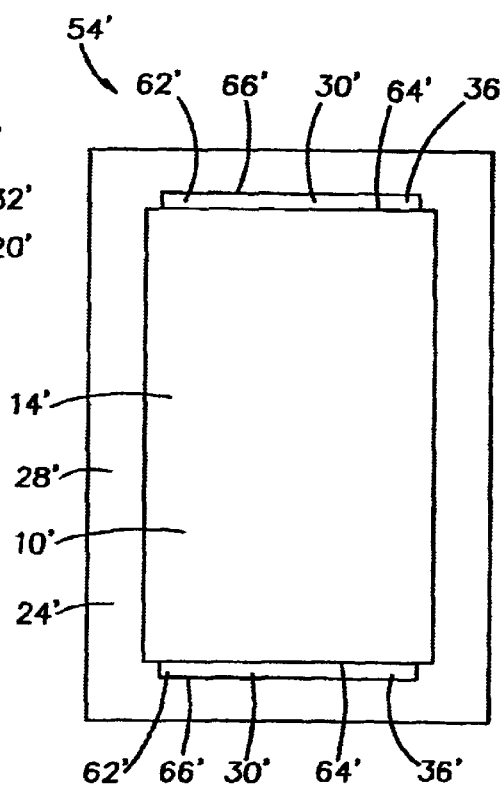
FIG. 8C is a bottom plan view of the die unit of FIG. 8A.

Referring to FIGS. 8A–8C, the support substrate 24' is dimensioned such that mounting the first (active) surface 12' of the die onto the underside 28' of the support substrate 24' provides a gap 62' between a peripheral edge 64' along side 16' of the die 10' and the wire bond slot 30' of the support substrate 24'. As shown, the gaps 62' are formed along opposing edges 64' along sides 16' of the die 10 and outer edges 66' of the shorter elongate segments 36' of the wire bond slot 30'. The bond pads 20' on the die 10' are then wire bonded to the bond pad fingers 32' on the support substrate 24', resulting in the die unit 54'.

As depicted in FIGS. 9A–9B, the die unit 54' can be encapsulated with a molding compound 56' to cover the bond wires 52', bond pad fingers 32', and wire bond slot 30' including electronic components and the bond pads 20' on the first (active) surface 12' of the die 10'. In the encapsulation step, the molding compound 56' is flowed through the gap 62' and onto the sides 16', 18', of the die 10'. The mold (not shown) into which the die unit 54' is placed for the encapsulation step, is structured and sized to provide sufficient clearance (i.e., an open space) along the sides 16', 18' of the die 10' into which the molding compound 56' can flow to encapsulate the sides.

Where it is desirable to encapsulate the second (inactive) surface 14' of the die 10, the mold (not shown) is structured to provide sufficient clearance along the second (inactive) surface 14' of the die to allow the molding compound 56' to flow over and encapsulate the second surface of the die, resulting in the die package 58' shown in FIGS. 9B–9C. The mold (not shown) can also be structured to prevent the molding compound 56' from flowing further onto the second (inactive) surface 14' of the die 10', such that the second (inactive) side of the die is exposed and not covered by the molding compound, resulting in the die package 58(1)' as depicted in FIGS. 9B', 9D. This embodiment 58(1)' of the die package provides a package having a reduced height (thickness), resulting in a thinner package overall.

Figure 10A:
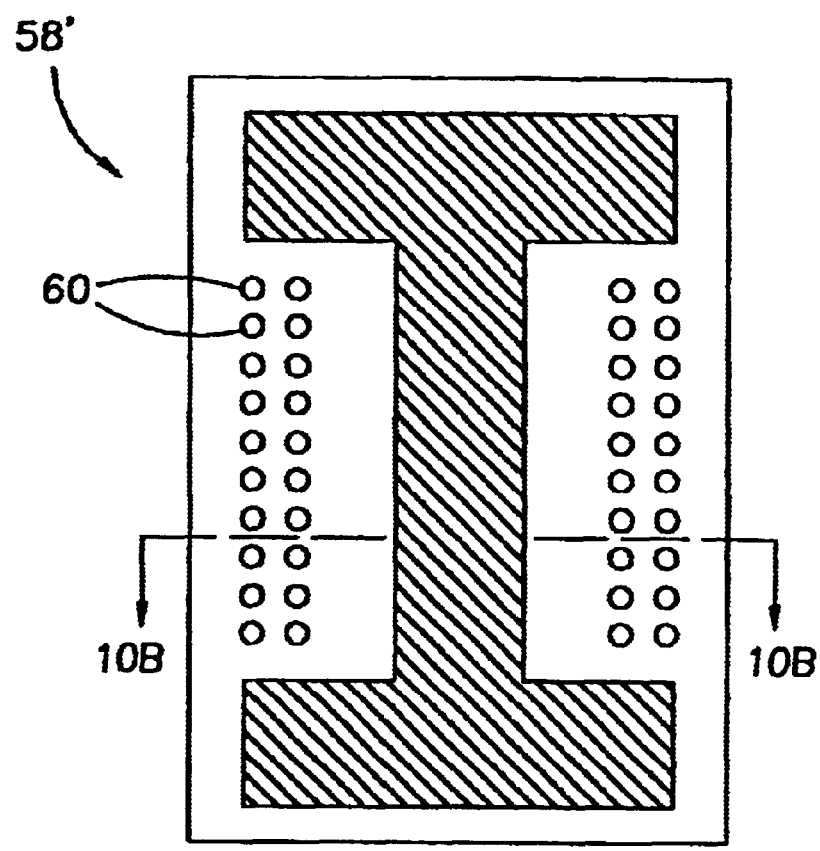
FIG. 10A is a top plan view of the encapsulated die package of FIG. 9A showing solder balls mounted thereon.
Figure 10B:
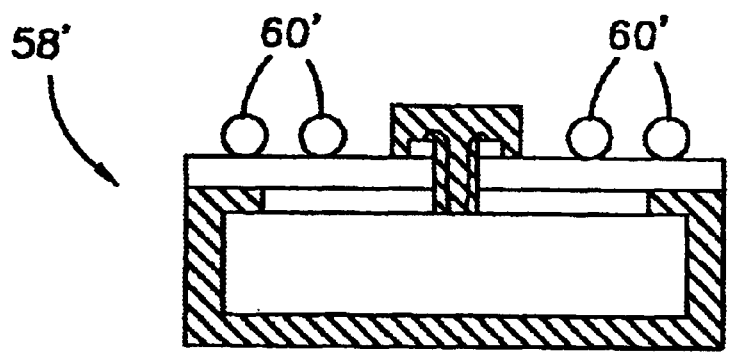
FIG. 10B is a side elevational view of the die package of FIG. 10A, taken along line 10B—10B.

Following the encapsulation, solder balls 60' can be bonded to the ball pads 42' on the first (upper) surface 26' of the support structure 24', as depicted in FIGS. 10A–10B.

Figure 12A:
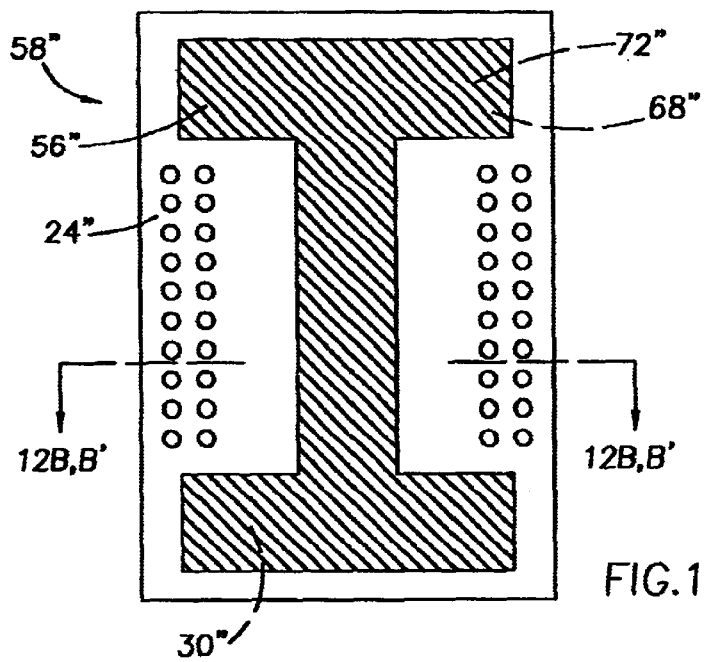
FIG. 12A is a top plan view of the die unit of FIG. 11A encapsulated according to a method of the invention.
Figure 12B:
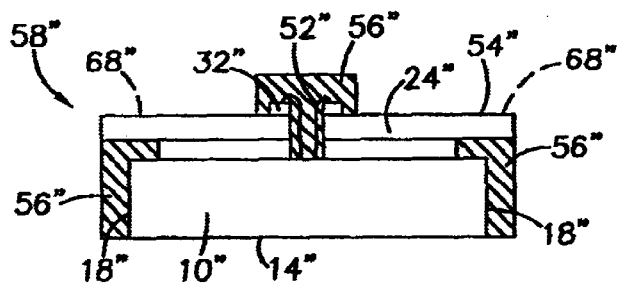
FIG. 12B is a side elevational view of an embodiment of the encapsulated die package of FIG. 12A, taken along line 12B,B'—12B,B', and showing encapsulated sides and an exposed second surface of the die.
Figure 12B:
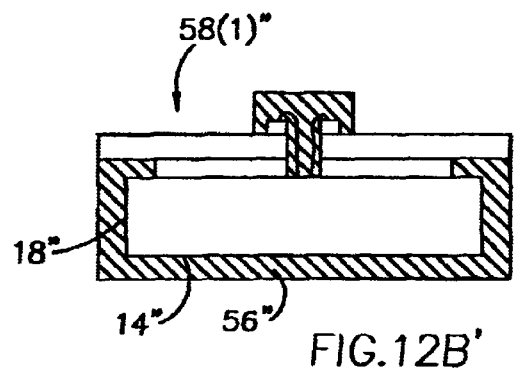
Figure 13A:
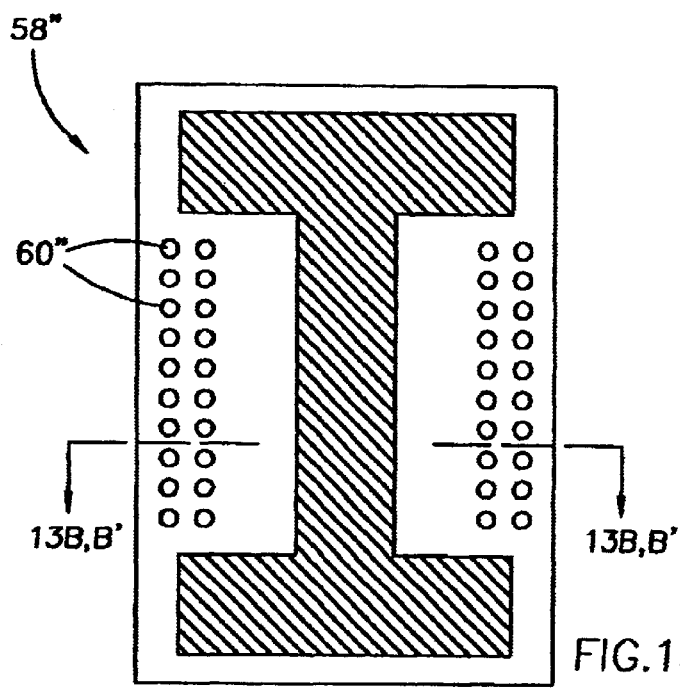
FIG. 13A is a top plan view of the encapsulated die package of FIG. 12A showing solder balls mounted thereon.
Figure 13B:
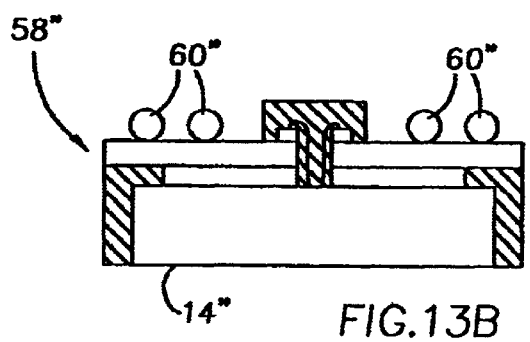
FIGS. 13B, 13B' are side elevational views of the encapsulated package of FIG. 13A, taken along line 13B,B'—13B,B', and corresponding to FIGS. 12B, 12B', respectively.
Figure 13B:
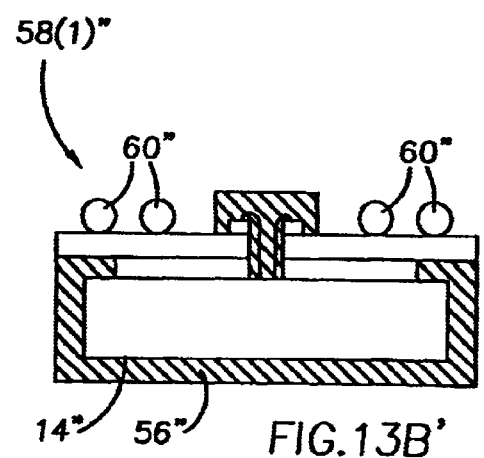

Yet another embodiment of a die package 58" and method according to invention is illustrated in FIGS. 11–13. The die unit 54" is again structured to allow the molding compound to flow onto and encapsulate the sides and, optionally, the second (inactive) surface of the die.

As shown in FIGS. 11A–11C, the support substrate 24" is provided with holes 68" therethrough, which are positioned adjacent to the opposing ends 70" of the shorter elongate segments 36" of the I-shaped wire bond slot 30". The die 10" and the support substrate 24' are dimensioned and configured such that mounting the first (active) surface 12" of the die 10" onto the underside 28" of the support substrate 24" forms a gap 72" between a peripheral edge 74" along the side 18" of the die 10" and the opposing ends 70" of the shorter elongate segments 36" of the wire bond slot 30", and also leaves the holes 68" through the support substrate 24 uncovered. The bond pads 20" on the die 10" are then wire bonded to the bond pad fingers 32" on the support substrate 24", resulting in the die unit 54".

In encapsulating the die unit 54", the molding compound 56" is flowed over the bonding wires 52" and bond pad fingers 32" and to fill the I-shaped wire bond slot 30", as depicted in FIG. 12A. The molding compound 56" is further flowed through the gaps 72" and the holes 68" in the substrate 24" onto the sides 16", 18" of the die 10", as depicted in FIG. 12B, resulting in the die package 58". Optionally, the molding compound 56" can be flowed onto the second (inactive) surface 14" of the die 10" as depicted in FIG. 12B', resulting in the die package 58(1)".

Solder balls 60" can then be bonded to the ball pads 42" on the upper surface 26" of the support structure 24", as depicted in FIG. 13A and in cross-sectional view in FIGS. 13B, 13B', corresponding to the embodiments depicted in FIGS. 12B, 12B', respectively.

It is understood that in the embodiment of the die unit 54" illustrated in FIGS. 11–13, that the die unit 54" can be structured with either or both of the described hole(s) 68" or gap(s) 72".

Figure 14A:
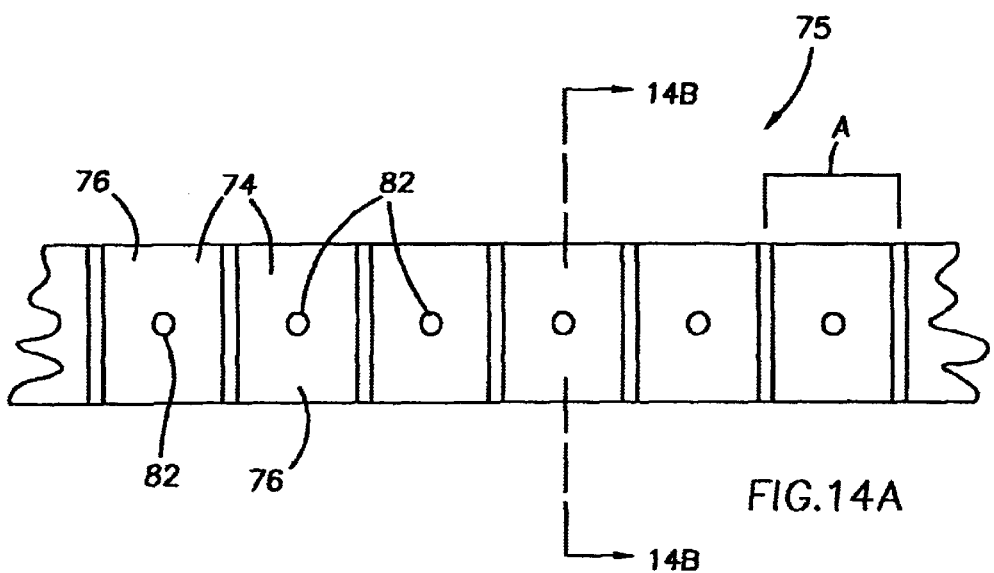
FIGS. 14A–E are sequential processing steps of an embodiment of a method of the invention for top gate molding the die unit shown in FIGS. 8A–8C.
Figure 14B:
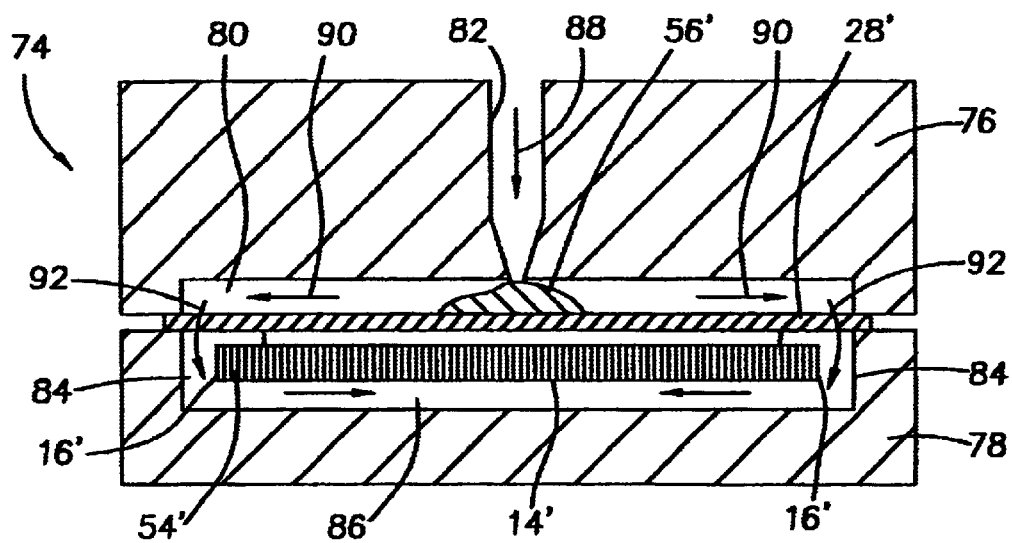

The invention can be applied to encapsulate one or both surfaces (and sides) of an IC die. Referring now to FIGS. 14A–14E, an embodiment of a mold 74 and method of encapsulating an integrated circuit die unit according to the invention will be described with reference to the die unit 54' depicted in FIGS. 8A–8C, which includes gaps 62' along the edges 64' of the integrated circuit die 10' and segment 36' of the wire bond slot 30'. As shown in FIG. 14A, the mold 74 can be initially a segment (A) of a panel or strip 75 to fabricate multiple die packages. Following the fabrication process for the packages, the panel 75 is singulated into individual BGA packages. As depicted in FIG. 14B, the mold 74 includes first and second plate members (mold halves) 76, 78, that define a chamber 80, the first plate member 76 having a top mold gate (pin cavity) 82 to provide a conduit for introducing a molding compound 56' into the chamber 80. It is understood that the described mold and method can be utilized for one-side encapsulation of an IC die as depicted with reference to FIGS. 1–7.

In the illustrated example to encapsulate a die unit having a gap (and/or a hole), the mold 74 is sized and structured to provide sufficient clearance (i.e., an open space 84, 86) along the sides 16', 18' and, if desired, along the second (inactive) surface 14' of the die 10', into which the molding compound 56' can flow to encapsulate the sides and second surface of the die. If it is desired that the second surface 14' of the die 10' remain exposed, the mold 74 can be structured to eliminate the open space 86 adjacent the second surface 14' of the die 10'.

According to the invention, the molding plates have been modified from a conventional configuration such that the mold gate 82 is formed in one of the first or second plate members 76, 78, and is oriented perpendicular to the upper side 28' of the support substrate 24' and the first (active) surface 12' of the die 10' of the die unit 54' positioned in the mold 74. As such, the molding compound 56' passes through the mold gate 82 in the direction of arrow 88, and flows directly onto the upper side 28' of the substrate and into the wire bond slot 30'. The molding compound 56 is flowed through the mold gate 82 under pressure, typically at about 500 psi to about 2,000 psi.

Figure 14C:
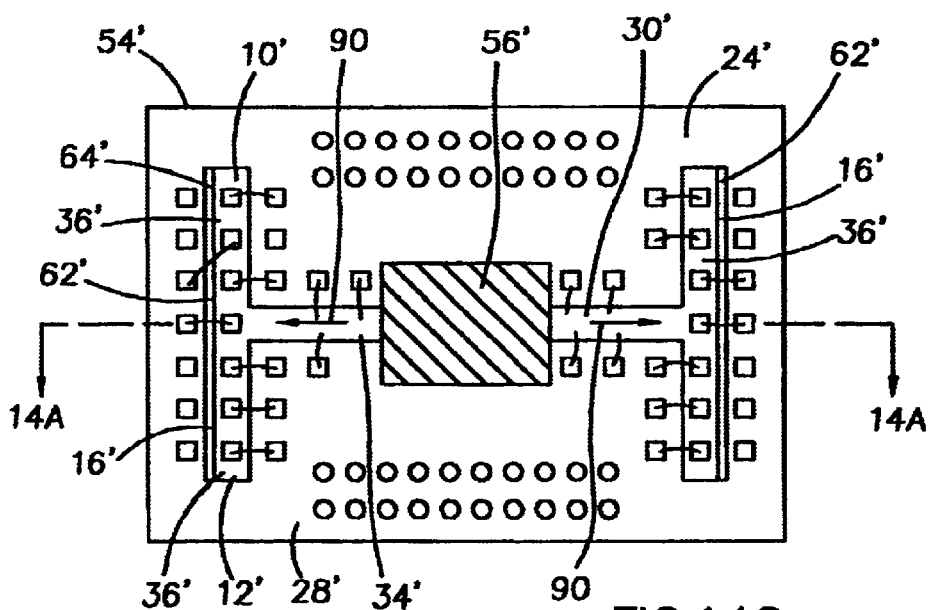
Figure 14D:
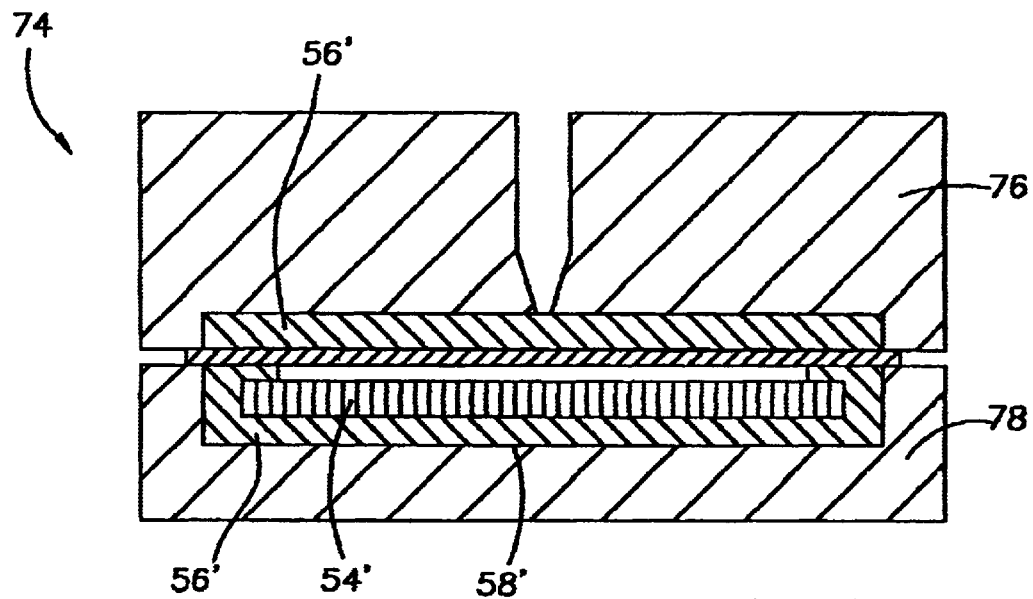
Figure 14E:
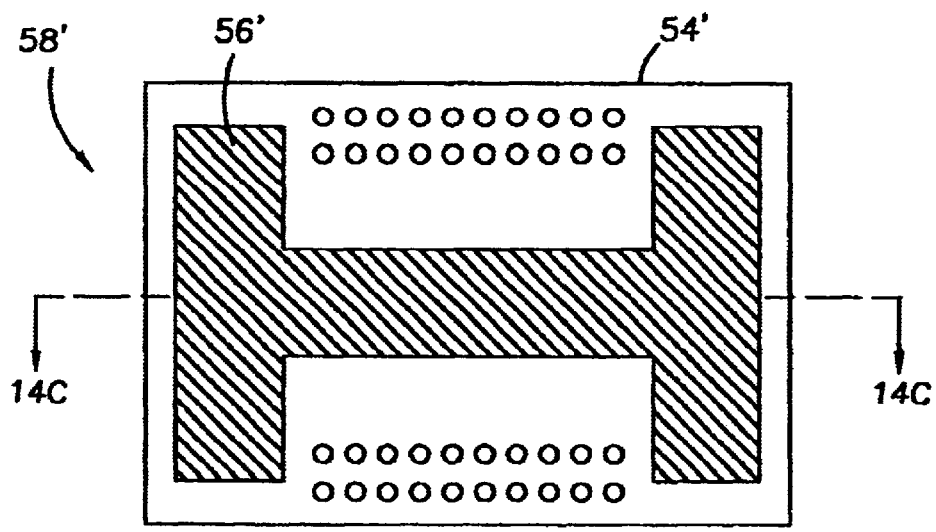

In the embodiment depicted in FIGS. 14B–14C, the mold gate 82 is located in the first plate member 76 (and oriented perpendicular to the second plate member 78) to dispense the molding compound 56' in a downward direction (arrow 88) onto the die unit 54' at about the center of the main elongate segment 34' of the I-shaped wire bond slot 30' of the support substrate 24'. The molding compound 56' is then flowed over the support substrate 24' and active surface 12' of the die 10' along the main elongate segment 34' in the direction of the arrows 90 to the shorter elongate segments 36' of the wire bond slot 30'. The molding compound 56' is then flowed through the gap 62' (arrow 92) and into the open spaces 84, 86 to cover the sides 16', 18' and the second surface 14' of the die 10'. The resulting encapsulated package 58' is depicted in FIGS. 14D–14E.

Figure 15A:
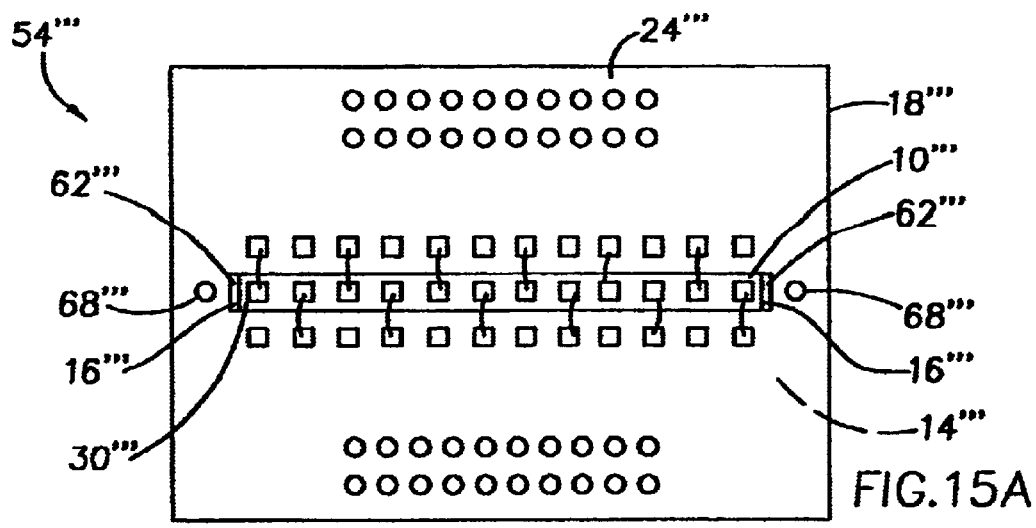
FIG. 15A is a top plan view of another embodiment of a die unit having an elongate opening (wire bond slot).
Figure 15B:
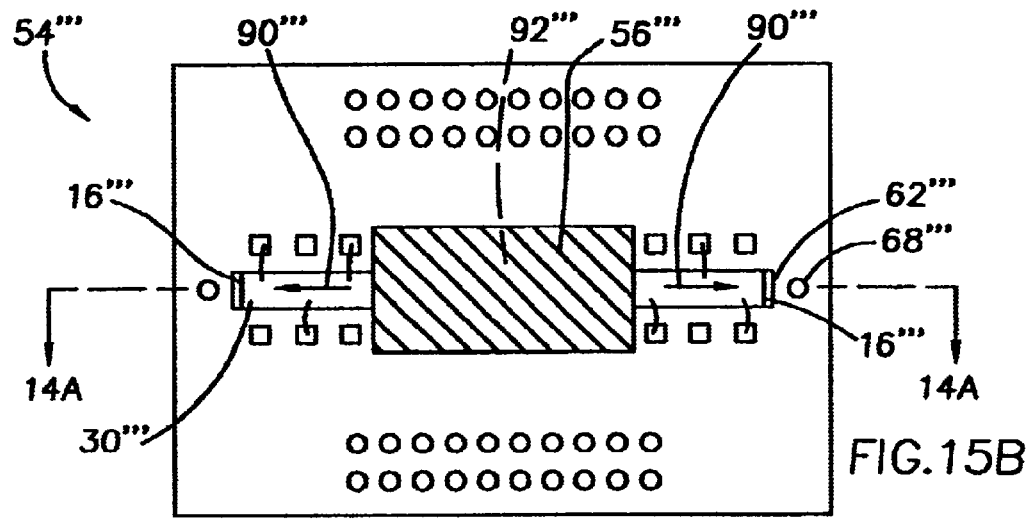
FIGS. 15B–15C are sequential processing steps for encapsulating the die unit of FIG. 15A according to an embodiment of a method of the invention utilizing the mold depicted in FIG. 14A.
Figure 15C:
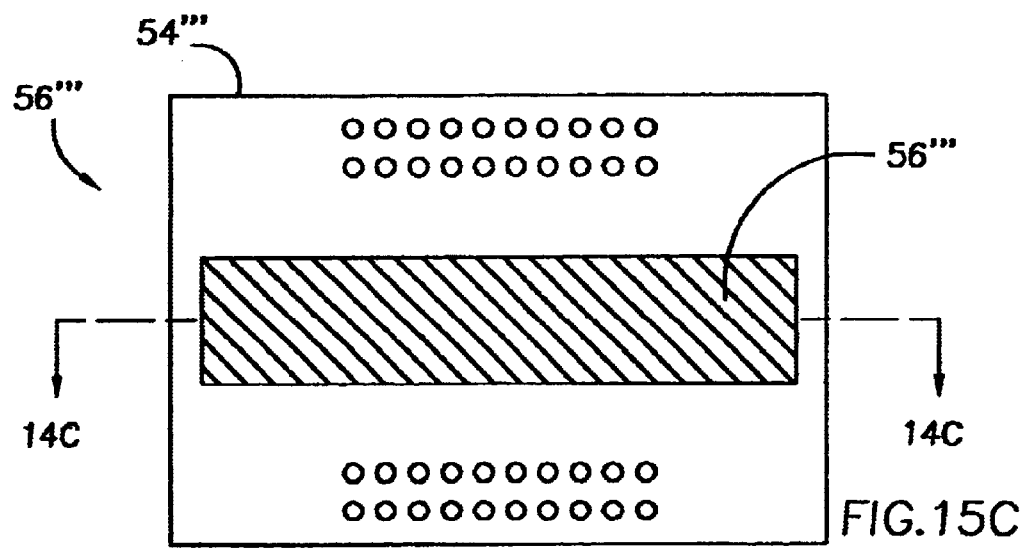

The method and mold described with reference to FIGS. 14A–14E can also be used to similarly encapsulate a die unit 54''' in which the wire bond slot in the support substrate is a different configuration such as an elongate opening 30''', as depicted in FIG. 15A. Optionally, as shown, the die unit 54'41 can include a gap 62''' and/or hole 68''' for passage of the molding compound 56''' onto the sides 16''', 18''', and the second (inactive) surface 14''' of the die 10'''. In the use of the mold 74 described in connection with FIGS. 14A–E, the molding compound 56''' can be flowed onto about the center 92''' of the elongate opening 30''' and to either end in the direction of arrows 90''', as shown in FIG. 15B. The molding compound 56''' can then be flowed through the gap 62''' and/or hole 68''' onto the sides (16''', 18''') of the die, and optionally onto the second surface (14''') of the die 10''' as desired (see FIG. 14B), resulting in the encapsulated package 58''' depicted in FIG. 15C (and in cross-section in FIG. 14D).

The location, size and shape of the top (or bottom) mold gate (pin cavity) is not restricted, and can be designed to achieve the optimal flow of the molding compound for different die and package sizes. It is understood that the mold gate can be located in the first or second plate members to dispense the molding compound directly onto the upper surface of the support substrate and the first (active) surface of the die of the die unit at any point along the wire bond slot of the support substrate.

Figure 16A:
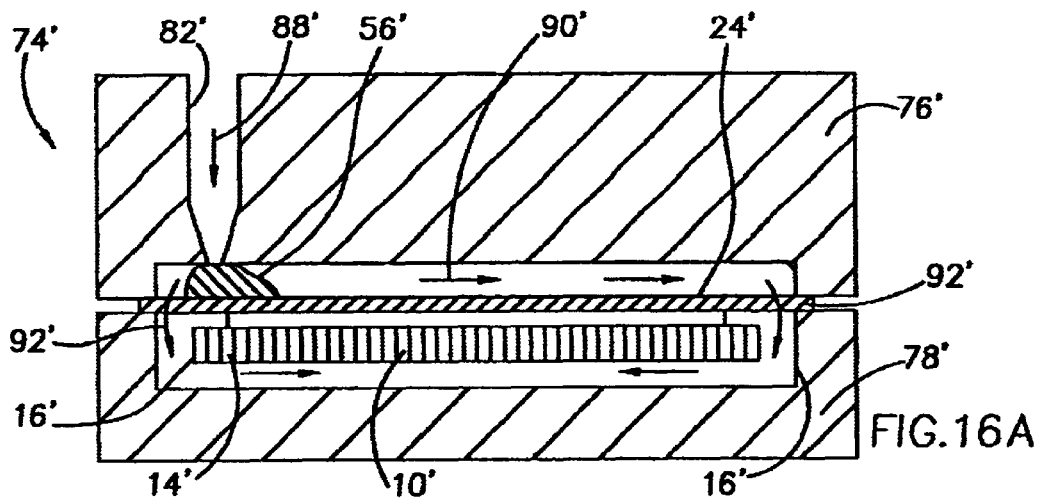
FIGS. 16A–B are sequential processing steps of another embodiment of a method of the invention for top gate molding a die unit according to the invention.
Figure 16B:
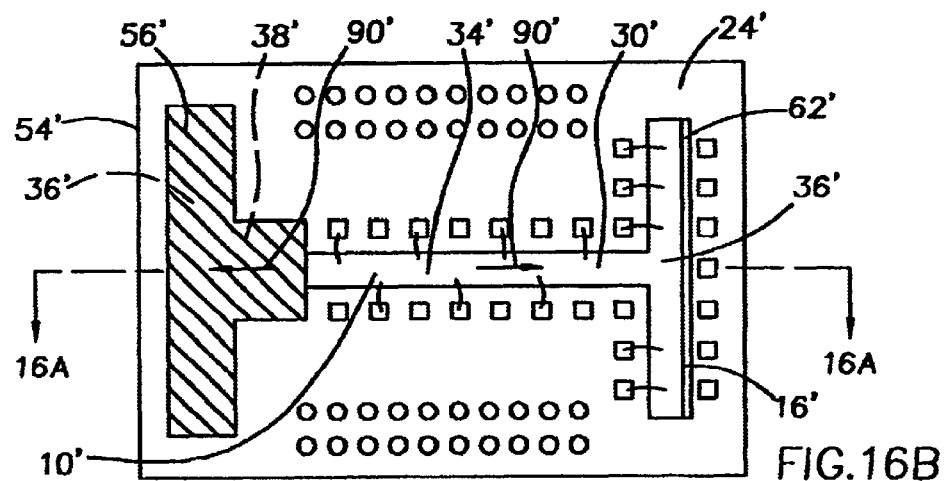
Figure 16B:
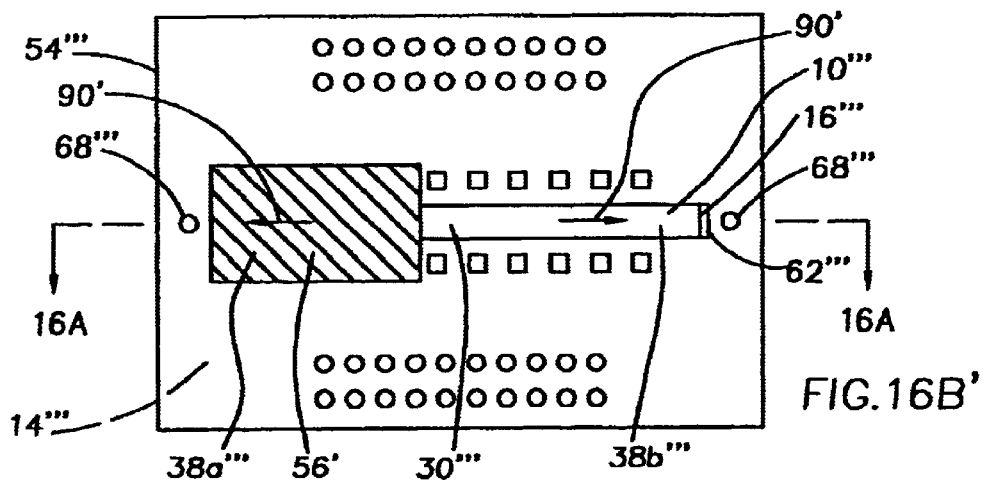

Another embodiment of a mold 74', is illustrated in FIGS. 16A–16B. As shown, the mold gate 82' is located at one end of the first plate member 76' to dispense the molding compound 56' in a downward direction at or near a first end 30' of the main elongate segment 34' of the I-shaped wire bond slot 30' in the support substrate 24'. The molding compound 56' is introduced through the mold gate 82' in the direction of arrow 88' onto the substrate 24' and into the wire bond slot 30'. The molding compound 56' is flowed in the direction of arrows 90' to the shorter elongate segments 36' of the wire bond slot 30', and through the gap 62' (and/or holes) in the direction of arrows 92'. As depicted, the molding compound 56' is flowed onto the sides 16' of the die 10' and (optionally) the second surface 14' of the die 10', resulting in a die package 58', such as depicted in FIGS. 14D–14E.

In another embodiment, the mold 74, 74' can be used to encapsulate a die unit having a different shaped wire bond slot in the substrate and bond pad layout, for example, the die unit 54''' having an elongate slot (opening) 30''' and pad layout, as shown in FIG. 15A. In such case, the molding compound 56''' can be flowed onto an end 38a''' of the elongate opening 30''' (FIGS. 16A, 16B') and in the direction of the arrows 90' to the other end 38b''' of the opening, and through the gap 62''' and/or hole 68''' to encapsulate the sides 16''', 18''', and second surface 14''' of the die 10'''.

Figure 17A:
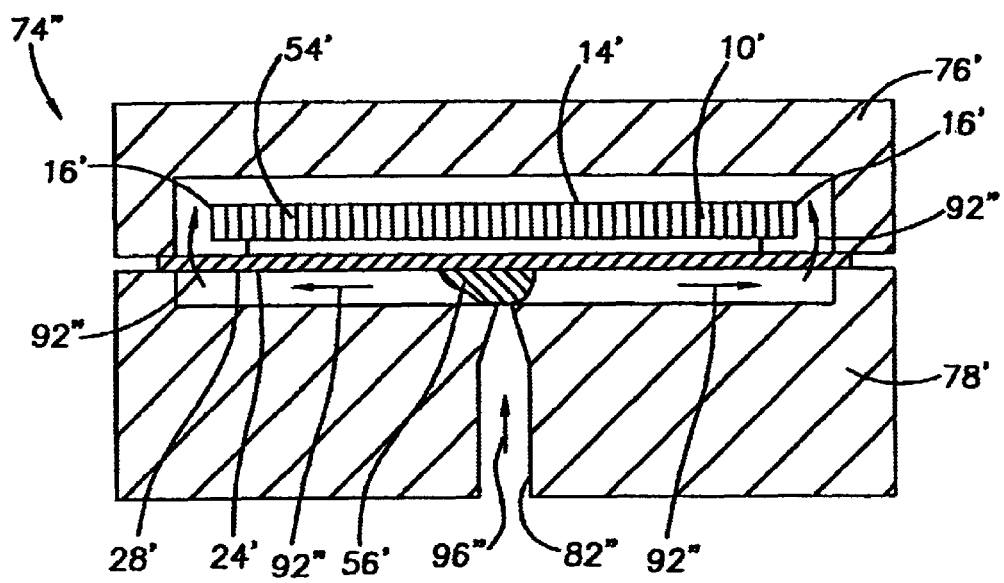
FIG. 17A is a side elevational view of another embodiment of a mold having a mold gate positioned for upward delivery of the molding compound onto the die unit, and the direction of flow of the compound.
Figure 17B:
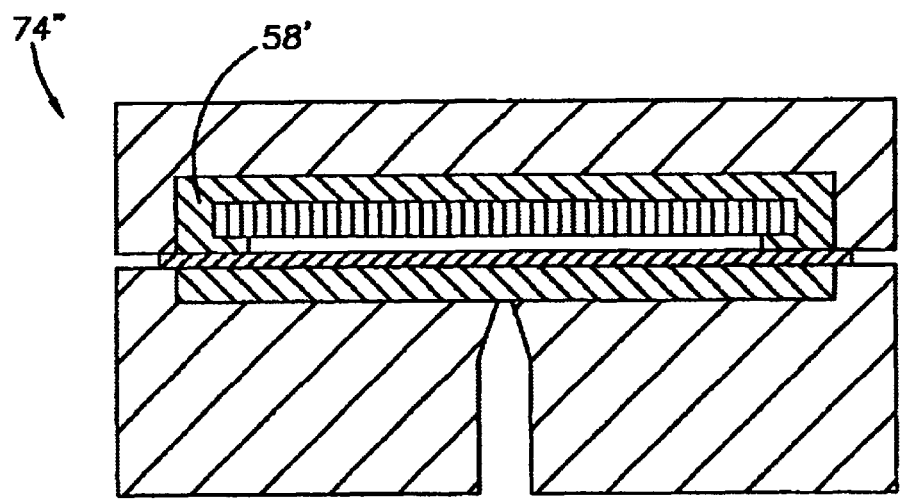
FIG. 17B depicts the encapsulated die package.

With the foregoing mold assemblies and methods, the mold gate 82, 82' is shown as being oriented with respect to the die unit to allow the molding compound to be introduced through the mold gate in a downwardly direction (arrow 88, 88') directly onto the first (active) surface of the die. In some applications, the downward flow of the molding compound can apply an amount of pressure onto the die unit that causes the support substrate and die to bend. To avoid such an effect, in another embodiment of a mold 74" and method illustrated in FIGS. 17A–17B, the mold gate 82" is oriented with respect to the die unit 54' such that the molding compound 56" is delivered through the mold gate 82" in an upward direction (arrows 96") onto the upper surface 28' of the support substrate 24' and into the wire bond slot (30'), and can be further flowed through a gap 62' and/or hole 68' in the direction of arrows 92" onto the sides 16', 18', and the second (inactive) surface 14' of the die 10', resulting in the encapsulated package 58' shown in FIG. 17B. The advantage of orienting the die over the substrate during the molding process and flowing the molding compound 56" in an upward direction onto the die unit provides an additional weight or force to present the substrate from bowing or bending. The mold gate 82" can be located in the second plate member 78' (as shown), or in the first plate member (76) as illustrated in FIG. 14D whereby the mold (74) can be flipped so that the molding compound can be flowed in a vertical direction (arrow 96") as depicted in FIG. 17A.

Either a conventional (side) mold gate molding process or the present top gate molding process can be utilized to encapsulate the BOC BGA die unit. Current molding methods of BOC devices utilize a mold having a mold gate along a side (perimeter) of the lower plate and positioned adjacent to the die edge. As such, the encapsulant material is dispensed horizontally into a side of the mold and flows under and over the support substrate onto the active surface of the die to cover the wire bonds. In the described top gate molding process, the molding compound enters the mold through a mold gate positioned in the surface of the first (or second) molding plate, perpendicular to the other molding plate and the surface of the die unit in the mold.

In a conventional molding method, the side-positioned mold gate in the lower molding plate is lined with a gold-plated copper foil to prevent encapsulant material from adhering to the edges of the substrate. Advantageously, the top mold gate of the present mold apparatus does not require a gold surface area on the substrate, thus providing a reduction in the substrate cost in the manufacture of BOC FBGA packages.

The present top gate molding process also optimizes mold yield (the number of acceptable molded packages), compared to conventional BOC molding processes, by reducing the number of rejected or substandard packages.

Other disadvantages of conventional molding techniques include the need for a standard wire bond slot quality for die placement, the use of a diversion dam to divert the flow of the molding compound within the mold cavity, and the lack of consistency in thickness (height) of the diversion dam, which are limited by a supplier's capability with slot fabrication and soldermask printing (copper plating) to form the diversion dam. Variations in thickness of the tape between the die and the substrate, the quality of the wire bond slot, and the height of the diversion dam can result in gaps being formed along the diversion dam through which molding compound can seep onto a surface of the die unit. Such seepage of the molding compound out of the flow of the molding compound through the mold cavity can lower mold yield. The use of the present top gate molding process advantageously eliminates the need for a diversion dam. Also, unlike current molding processes that require different diversion dam locations and heights to accommodate different tape thicknesses, the use of the present top gate molding process can be successfully applied to die units over a wide range of tape thicknesses. Elimination of the diversion dam also reduces package size configuration. In addition, the top gate molding process requires fewer process steps for substrate fabrication, resulting in shorter substrate delivery lead time and lower substrate costs.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an integrated circuit die package, comprising the steps of:

providing a mold containing a die unit; the mold having a molding chamber and a mold gate providing a conduit for introducing a molding compound into the chamber; the die unit comprising a die having a first surface, a second surface, and sides; the first surface of the die comprising a plurality of bond pads disposed thereon, and being mounted onto a support substrate with the bond pads exposed through an opening of the support substrate; the die unit positioned within the mold such that the mold gate is oriented perpendicular to the opening in the support substrate of the die unit; and introducing a molding compound through the mold gate to flow the molding compound into the opening in the support substrate of the die unit to enclose the bond pads on the die.

2. The method of claim 1, wherein the introducing step comprising flowing the molding compound in a downward direction into the opening in the support substrate.

3. The method of claim 1, wherein the introducing step comprising flowing the molding compound in an upward direction into the opening in the support substrate.

4. The method of claim 1, wherein the mold comprises first and second molding plates, and the mold gate is positioned in the first molding plate such that the molding compound is flowed into one end of the opening of the support substrate, and from one end of the opening to the other end.

5. The method of claim 1, wherein the mold comprises first and second molding plates, and the mold gate is positioned at about the center of the first molding plate such that the molding compound is flowed onto about the center of the opening of the support substrate and toward each end of the opening.

6. The method of claim 1, wherein the die is mounted onto the support substrate to provide a gap between a peripheral edge of the die and the opening of the support substrate, and in the step of introducing the molding compound, the molding compound is flowed through the gap and onto the sides of the die.

7. The method of claim 6, wherein in the step of introducing the molding compound, the molding compound is further flowed onto the second surface of the die.

8. The method of claim 6, wherein the mold is structured to allow flowing of the molding compound onto the second surface of the die.

9. The method of claim 6, wherein the mold is structured to prevent flowing of the molding compound onto the second surface of the die, and the second surface of the die is not encapsulated by the molding compound.

10. The method of claim 1, wherein the support substrate comprises a hole therethrough and the die is mounted onto the support substrate such that the hole through the substrate is uncovered; and in the step of introducing the molding compound, the molding compound is flowed through the hole in the substrate and onto the sides of the die.

11. The method of claim 1, wherein the bond pads are in an I-shaped layout on the first surface of the die; and the opening of the support substrate is I-shaped corresponding to the layout of the bond pads.

12. A method of forming an integrated circuit die package, comprising the steps of:
providing a mold containing a die unit; the mold having first and second molding plates, a molding chamber, and a mold gate through the first molding plate providing a conduit for flowing a molding compound into the chamber, the mold gate oriented perpendicular to the second molding plate; the die unit comprising a die having a first surface, a second surface, and sides; the first surface of the die comprising a plurality of bond pads disposed thereon, and being mounted onto a support substrate with the bond pads exposed through an opening of the support substrate; the die unit positioned within the mold such that the mold gate is oriented perpendicular to the opening in the support substrate of the die unit; and
introducing a molding compound through the mold gate to flow the molding compound into the opening in the support substrate of the die unit.

13. A method of forming an integrated circuit die package, comprising the steps of:
providing a mold containing a die unit; the mold having a molding chamber and a mold gate providing a conduit for introducing a molding compound into the chamber; the die unit comprising a die having a first surface, a second surface, and sides; the first surface of the die comprising a plurality of bond pads disposed thereon, and being mounted onto a support substrate with the bond pads exposed through an opening of the support substrate, and a gap provided between a peripheral edge of the die and the opening of the support substrate; the die unit positioned within the mold such that the mold gate is oriented perpendicular to the opening in the support substrate of the die unit; and
introducing a molding compound through the mold gate to flow the molding compound into the opening in the support substrate of the die unit to enclose the bond pads on the die.

14. The method of claim 13, wherein the mold is structured to allow flowing of the molding compound onto the second surface of the die; and the introducing step further comprises flowing the molding compound through the gap and onto the second surface of the die.

15. The method of claim 13, wherein the mold is structured to prevent flowing of the molding compound onto the second surface of the die, whereby the introducing step further comprises flowing the molding compound through the gap and onto the sides of the die, and the second surface of the die is not covered with the molding compound.

16. The method of claim 13, wherein the bond pads are in an I-shaped layout on the first surface of the die; and the opening of the support substrate is I-shaped corresponding to the layout of the bond pads.

17. The method of claim 16, wherein the I-shaped opening of the support substrate comprises a main elongate segment and a pair of shorter elongate segments positioned perpendicular to and on opposing ends of the main segment, and the gap is provided between the die and an edge of at least one of the shorter elongate segments.

18. The method of claim 13, wherein the support substrate further comprises holes therethrough on opposite ends of and adjacent to the shorter elongate segments of the I-shaped opening; and the die is mounted onto the support substrate such that the holes through the support substrate are uncovered; and in the step of introducing the molding compound, the molding compound is flowed through the gap and the holes in the substrate and onto the sides of the die.

19. A method of forming an integrated circuit die package, comprising the steps of:
providing a mold containing a die unit; the mold having first and second molding plates, a molding chamber and a mold gate providing a conduit for introducing a molding compound into the chamber; the die unit comprising a die having a first surface, a second surface, and sides; the first surface of the die comprising a plurality of bond pads disposed thereon, and being mounted onto a support substrate with the bond pads exposed through an opening of the support substrate; the die unit positioned within the mold and the mold gate positioned in the first molding plate such that the mold gate is oriented perpendicular to the one end of the opening in the support substrate of the die unit; and
introducing a molding compound through the mold gate to flow the molding compound into the one end of the opening in the support substrate of the die unit and from one end of the opening to the other end of the opening to enclose the bond pads on the die.

20. A method of forming an integrated circuit die package, comprising the steps of:
providing a mold containing a die unit; the mold having first and second molding plates, a molding chamber and a mold gate providing a conduit for introducing a molding compound into the chamber; the die unit comprising a die having a first surface, a second surface, and sides; the first surface of the die comprising a plurality of bond pads disposed thereon, and being mounted onto a support substrate with the bond pads exposed through an opening of the support substrate; the die unit positioned within the mold and the mold gate positioned in the first molding plate such that the mold gate is oriented perpendicular to about the center of the opening in the support substrate of the die unit; and
introducing a molding compound through the mold gate to flow the molding compound into about the center of the opening in the support substrate of the die unit and toward each end of the opening to enclose the bond pads on the die.

21. A method of forming an integrated circuit die package, comprising the steps of:
providing a mold containing a die unit; the mold having a molding chamber and a mold gate providing a conduit for introducing a molding compound into the chamber; the die unit comprising a die and a support substrate, the die having a first surface, a second surface, and sides, the first surface of the die comprising a plurality of bond pads disposed thereon; the support substrate having a hole therethrough; and the die being mounted onto the support substrate with the bond pads exposed through an opening of the support substrate and the hole through the substrate uncovered; the die unit positioned within the mold such that the mold gate is oriented perpendicular to the opening in the support substrate of the die unit; and
introducing a molding compound through the mold gate to flow the molding compound into the opening in the support substrate of the die unit and through the hole in the substrate to enclose the bond pads and the sides of the die.

22. A method of forming an integrated circuit die package, comprising the steps of:

providing a mold containing a die unit; the mold having a molding chamber and a mold gate providing a conduit for introducing a molding compound into the chamber; the die unit comprising a die having a first surface, a second surface, and sides; the first surface of the die comprising a plurality of bond pads disposed thereon in an I-shaped layout, and being mounted onto a support substrate with the bond pads exposed through an I-shaped opening of the support substrate; the die unit positioned within the mold such that the mold gate is oriented perpendicular to the opening in the support substrate of the die unit; and introducing a molding compound through the mold gate to flow the molding compound into the opening in the support substrate of the die unit to enclose the bond pads on the die.

23. A method for encapsulating an integrated circuit die, comprising the steps of:

providing a mold having a molding chamber and a mold gate providing a conduit for introducing a molding compound into the chamber;

providing a die unit comprising a die having a first surface, a second surface, and sides; the first surface of the die having a plurality of bond pads disposed thereon, the first surface of the die mounted onto a support substrate with the bond pads exposed through an opening of the support substrate;

placing the die unit in the mold with the mold gate oriented perpendicular to the first surface of the die; and introducing a molding compound through the mold gate whereby the molding compound flows into the opening in the support substrate to enclose the bond pads on the die.

24. The method of claim 23, wherein the mold gate is positioned at one end of the opening of the support substrate, and the molding compound is flowed from one end of the opening to the other end.

25. The method of claim 23, wherein the mold gate is positioned at about the center of the opening of the support substrate, and the molding compound is flowed onto about the center of the opening and toward each end of the opening.

26. A method for encapsulating an integrated circuit die, comprising the steps of:

providing a mold having a molding chamber and a mold gate providing a conduit for introducing a molding compound into the chamber;

providing a die unit comprising a die having a first surface, a second surface, and side surfaces; the first surface of the die having a plurality of bond pads disposed thereon; the first surface of the die mounted onto a support substrate with the bond pads exposed through an opening of the support substrate, and a gap provided between a peripheral edge of the die and the opening of the support substrate;

placing the die unit in the mold with the mold gate oriented perpendicular to opening of the support substrate and the first surface of the die; and introducing a molding compound through the mold gate to flow the molding compound into the opening of the support substrate to enclose the bond pads on the die, and through the gap onto the sides of the die.

27. The method of claim 26, wherein the introducing step further comprising flowing the molding compound through the gap and onto the second surface of the die.

28. The method of claim 26, wherein the mold is structured to allow flowing of the molding compound onto the second surface of the die.

29. The method of claim 26, wherein the mold is structured to prevent flowing of the molding compound onto the second surface of the die, and the second surface of the die is not covered with the molding compound.

30. The method of claim 26, wherein the bond pads are in an I-shaped layout on the first surface of the die; and the opening of the support substrate is I-shaped corresponding to the layout of the bond pads.

31. The method of claim 26, wherein the I-shaped opening of the support substrate comprises a main elongate segment and a pair of shorter elongate segments positioned perpendicular to and on opposing ends of the main segment, and the gap is provided between the die and an edge of at least one of the shorter elongate segments.

32. The method of claim 26, wherein the support substrate further comprises holes therethrough on opposite ends of and adjacent to the shorter elongate segments of the I-shaped opening; and the die is mounted onto the support substrate such that the holes through the support substrate are uncovered; and in the step of introducing the molding compound, the molding compound is flowed through the gap and the holes in the substrate and onto the sides of the die.

33. A method for encapsulating an integrated circuit die, comprising the steps of:

providing a die comprising a first surface, a second surface, and opposing sides; the first surface with electrical elements and a plurality of bond pads disposed thereon, the bond pads in an I-shaped layout on the first surface;

mounting the first surface of the die onto a support substrate with the bond pads exposed through an opening of the support substrate; the opening being I-shaped;

electrically connecting the bond pads through the opening to bond pad fingers mounted on the support substrate adjacent to the opening to form a die unit;

providing a mold having a molding chamber and a mold gate providing a conduit for introducing a molding compound into the chamber;

placing the die unit in the mold with the mold gate oriented perpendicular to the opening of the support substrate of the die unit; and introducing a molding compound through the mold gate to flow the molding compound into the opening of the support substrate to enclose the electrical elements and bond pads on the first surface of the die unit.

34. The method of claim 33, wherein the die is mounted onto the support substrate to provide a gap between a peripheral edge of the die and the opening of the support substrate; and in the step of introducing the molding compound, the molding compound flows through the gap and onto at least the sides of the die.

35. The method of claim 34, wherein the mold is structured to allow flowing of the molding compound to enclose the second surface of the die.

36. The method of claim 34, wherein the mold is structured to prevent flowing of the molding compound onto the second surface of the die, and the second surface of the die is not covered with the molding compound.

37. The method of claim 33, wherein the I-shaped opening of the support substrate comprises a main elongate segment and a pair of shorter elongate segments positioned perpendicular to and on opposing ends of the main segment, and the gap is provided along a side of at least one of the shorter elongate segments.

38. The method of claim 33, wherein the support substrate further comprises holes therethrough on opposite ends of and adjacent to the shorter elongate segments of the I-shaped opening; and the die is mounted onto the support substrate such that the holes through the support substrate are uncovered; and in the step of introducing the molding compound, the molding compound is flowed through the gap and the holes in the substrate and onto at least the sides of the die.

39. A method for encapsulating an integrated circuit die, comprising the steps of:
providing a mold having a molding chamber and a mold gate providing a conduit for introducing a molding compound into the chamber;
providing a die comprising a first surface and a second surface, the first surface with electrical elements and a plurality of bond pads disposed thereon;
providing a support substrate comprising an opening, a plurality of bond pad fingers disposed on a side of the substrate adjacent to the opening, and a plurality of ball pads disposed on the substrate adjacent to the bond pad fingers;
mounting the die onto the support substrate to align and expose the plurality of bond pads through the opening of the support substrate;
electrically connecting the bond pads through the opening to the bond pad fingers on the support substrate to provide a die unit;
providing a mold having a molding chamber and a mold gate providing a conduit for introducing a molding compound into the chamber;
placing the die unit in the mold with the mold gate oriented perpendicular to the opening in the substrate and the first surface of the die; and
introducing a molding compound through the mold gate whereby the molding compound flows directly into the opening in the support substrate to enclose the bond pad fingers and the electrical elements of the die.

40. A method for encapsulating an integrated circuit die, comprising the steps of:
providing a mold having a molding chamber and a mold gate providing a conduit for introducing a molding compound into the chamber;
providing a die comprising a first surface, a second surface, and sides; the first surface with electrical elements and a plurality of bond pads disposed thereon;
providing a support substrate having an I-shaped opening comprising a main elongate segment and a pair of shorter elongate segments positioned perpendicular to and on opposing ends of the main segment; a plurality of bond pad fingers disposed on a side of the substrate adjacent to the opening, and a plurality of ball pads disposed on the substrate adjacent to the bond pad fingers;
mounting the die onto the support substrate to align the bond pads within the I-shaped opening of the support substrate, and provide a gap along a peripheral edge of the die and an edge of at least one of the shorter elongate segments of the opening in the support substrate;
electrically connecting the bond pads through the opening to the bond pad fingers on the support substrate;
providing a mold having a molding chamber and a mold gate providing a conduit for introducing a molding compound into the chamber;
placing the mounted die in the mold with the mold gate oriented perpendicular to the opening in the substrate; and
introducing a molding compound through the mold gate to flow the molding compound into the opening into the substrate to enclose the bond pad fingers and the electrical elements of the die, and through the gap to enclose the sides of the die.

41. A method for encapsulating an integrated circuit die, comprising the steps of:
providing a mold having a molding chamber and a mold gate providing a conduit for introducing a molding compound into the chamber;
providing a die comprising a first surface, a second surface, and sides; the first surface with electrical elements and a plurality of bond pads disposed thereon;
providing a support substrate having an I-shaped opening comprising a main elongate segment and a pair of shorter elongate segments positioned perpendicular to and on opposing ends of the main segment; a plurality of bond pad fingers disposed on a side of the substrate adjacent to the opening, and a plurality of ball pads disposed on the substrate adjacent to the bond pad fingers;
mounting the die onto the support substrate to align the bond pads within the I-shaped opening of the support substrate, and provide a gap along a peripheral edge of the die and an edge of at least one of the shorter elongate segments of the opening of the support substrate;
electrically connecting the bond pads through the opening to the bond pad fingers on the support substrate;
providing a mold having a molding chamber and a mold gate providing a conduit for introducing a molding compound into the chamber;
placing the mounted die in the mold with the mold gate oriented perpendicular to the opening of the support substrate; and
introducing a molding compound through the mold gate to flow the molding compound into the opening of the substrate to enclose the bond pad fingers and the electrical elements of the die, and through the gap to enclose the sides of the die.

42. A method for encapsulating an integrated circuit die, comprising the steps of:
providing a mold having a molding chamber and a mold gate providing a conduit for introducing a molding compound into the chamber;
providing a die comprising a first surface, a second surface, and sides; the first surface with electrical elements and a plurality of bond pads formed thereon;
providing a support substrate having an I-shaped opening comprising a main elongate segment and a pair of shorter elongate segments positioned perpendicular to and on opposing ends of the main segment; a hole through the support substrate on opposite ends of and adjacent to the shorter elongate segments of the I-shaped opening; a plurality of bond pad fingers formed on a side of the substrate adjacent to the opening, and a plurality of ball pads formed on the substrate adjacent to the bond pad fingers;

mounting the die onto the support substrate to align the bond pads within the I-shaped opening of the support substrate such that the holes through the support substrate are uncovered;

electrically connecting the bond pads through the opening to the bond pad fingers on the support substrate;

providing a mold having a molding chamber and a mold gate providing a conduit for introducing a molding compound into the chamber;

placing the mounted die in the mold with the mold gate oriented perpendicular to the opening in the support substrate; and introducing a molding compound through the mold gate to flow the molding compound directly into the opening of the substrate to enclose the bond pad fingers and the electrical elements of the die, and through the hole in the substrate onto the sides of the die.

43. A method for encapsulating an integrated circuit die, comprising the steps of:

providing a mold having a molding chamber and a mold gate providing a conduit for introducing a molding compound into the chamber;

providing a die comprising a first surface, a second surface, and sides; the first surface with electrical elements and a plurality of bond pads formed thereon;

providing a support substrate having an I-shaped opening comprising a main elongate segment and a pair of shorter elongate segments positioned perpendicular to and on opposing ends of the main segment; a hole through the support substrate on opposite ends of and adjacent to the shorter elongate segments of the I-shaped opening; a plurality of bond pad fingers formed on a side of the substrate adjacent to the opening, and a plurality of ball pads formed on the substrate adjacent to the bond pad fingers;

mounting the die onto the support substrate to align the bond pads within the I-shaped opening of the support substrate such that the holes through the support substrate are uncovered, and a gap is provided along a peripheral edge of the die and an edge of at least one of the shorter elongate segments of the opening of the support substrate;

electrically connecting the bond pads through the opening to the bond pad fingers on the support substrate;

providing a mold having a molding chamber and a mold gate providing a conduit for introducing a molding compound into the chamber;

placing the mounted die in the mold with the mold gate oriented perpendicular to the opening in the support substrate; and introducing a molding compound through the mold gate to flow the molding compound into the opening of the substrate to enclose the bond pad fingers and the electrical elements of the die, and through the gap and the hole in the substrate onto the sides of the die.

44. A method for encapsulating an integrated circuit die, comprising the steps of:

providing a mold having a molding chamber and a mold gate providing a conduit for introducing a molding compound into the chamber;

providing a die unit having a die comprising a first surface, a second surface, and sides, the first surface with electrical elements and a plurality of bond pads formed thereon; the first surface of the die mounted onto a support substrate with the bond pads exposed through an opening of the support substrate;

placing the die unit in the mold with the mold gate oriented perpendicular to the opening in the support substrate; and introducing a molding compound through the mold gate whereby the molding compound flows in a downward direction into the opening in the substrate to enclose the electrical elements and bond pads on the die.

45. A method for encapsulating an integrated circuit die, comprising the steps of:

providing a mold having a molding chamber and a mold gate providing a conduit for introducing a molding compound into the chamber;

providing a die unit comprising a die having a first surface, a second surface, and sides, the first surface of the die with electrical elements and a plurality of bond pads formed thereon, and the first surface of the die mounted onto a support substrate with the bond pads exposed through an opening of the support substrate;

placing the die unit in the mold with the mold gate oriented perpendicular to opening in the support substrate; and introducing a molding compound through the mold gate whereby the molding compound flows in an upward direction into the opening in the substrate to enclose the electrical elements and bond pads on the die.

46. A method for encapsulating an integrated circuit die, comprising the steps of:

providing a mold having a molding chamber and a mold gate providing a conduit for introducing a molding compound into the chamber;

providing a die unit comprising a die having a first surface, a second surface, and sides, the first surface with electrical elements and a plurality of bond pads disposed thereon; the first surface of the die mounted onto a support substrate with the bond pads exposed through an opening of the support substrate;

placing the die unit in the mold with the mold gate oriented perpendicular to the opening in the support substrate and positioned at about the center of the opening; and introducing a molding compound through the mold gate to flow the molding compound into the opening of the support substrate at or about the center of the opening and toward each end of the opening to enclose the electrical elements and bond pads on the die.

47. A method for encapsulating an integrated circuit die, comprising the steps of:

providing a mold having a molding chamber and a mold gate providing a conduit for introducing a molding compound into the chamber;

providing a die unit comprising a die having a first surface, a second surface, and sides; the first surface of the die with electrical elements and a plurality of bond pads formed thereon; the first surface of the die mounted onto a support substrate with the bond pads exposed through an opening of the support substrate;

placing the die unit in the mold with the mold gate oriented perpendicular to the opening in the support substrate and positioned at one end of the opening; and introducing a molding compound through the mold gate to flow the molding compound into the opening in the substrate and from one end of the opening to the other end to enclose the electrical elements and bond pads on the die.

48. A method of forming an integrated circuit die package, comprising the steps of:

providing a mold containing a die unit; the mold having a molding chamber and a mold gate providing a conduit for introducing a molding compound into the chamber; the die unit comprising a die having a first surface, a second surface, and sides; the first surface of the die comprising a plurality of bond pads disposed thereon, and being mounted onto a support substrate with the bond pads exposed through an opening of the support substrate; the die unit positioned within the mold such that the mold gate is oriented to introduce the molding compound perpendicularly and directly into the opening in the support substrate of the die unit, and the mold gate is positioned at one end of the support substrate; and introducing a molding compound through the mold gate to flow the molding compound into the opening in the support substrate of the die unit to enclose the bond pads on the die such that the molding compound is flowed from one end of the opening of the support substrate to the other end.

49. A method for encapsulating an integrated circuit die, comprising the steps of:

providing a mold having a molding chamber and a mold gate providing a conduit for introducing a molding compound into the chamber;

providing a die unit comprising a die having a first surface, a second surface, and sides; the first surface of the die having a plurality of bond pads disposed thereon, the first surface of the die mounted onto a support substrate with the bond pads exposed through an opening of the support substrate;

placing the die unit in the mold with the mold gate oriented to introduce the molding compound perpendicularly and directly into the opening in the support substrate, the mold gate being positioned at one end of the opening of the support substrate;

introducing a molding compound through the mold gate whereby the molding compound flows into the opening in the support substrate to enclose the bond pads on the die and that the molding compound is flowed from one end of the opening of the support substrate to the other end.

50. A method for fabricating an integrated circuit die, comprising the steps of:

providing a die comprising bond pads disposed on a first surface in an I-shaped layout; and mounting the first surface of the die onto a support substrate with the bond pads exposed through an I-shaped opening in the support substrate.

51. The method of claim 50, further comprising: electrically connecting the bond pads to bond pad fingers disposed on the support substrate.

52. The method of claim 51, further comprising: encapsulating at least the bond pads.

53. The method of claim 50, wherein the step of mounting the die onto the support substrate comprises providing a gap between a peripheral edge of the die and the opening of the support substrate.

54. The method of claim 50, further comprising: prior to the step of mounting the die, the step of attaching an adhesive layer to the first surface of the die, to the support substrate, or both.

55. The method of claim 54, wherein the adhesive layer comprises an I-shaped opening corresponding to the opening of the support substrate.

56. The method of claim 55, wherein the adhesive layer is attached to the support substrate to correspond the opening of the adhesive layer with the opening of the support substrate.

57. The method of claim 55, wherein the adhesive layer is attached to the first surface of the die such that, upon mounting the die on the support substrate, the opening of the adhesive layer corresponds with the opening of the support substrate.

58. The method of claim 54, wherein the adhesive layer comprises a pair of adhesive strips attached to the support substrate on opposite sides and adjacent to the I-shaped opening.

59. The method of claim 54, wherein the adhesive layer comprises a pair of adhesive strips attached to the first surface of the die such that, upon mounting the die on the support substrate, the adhesive strips are attached to the support substrate on opposite sides and adjacent to the I-shaped opening.

60. The method of claim 50, wherein the die further comprises solder balls disposed on the support substrate adjacent to the bond pad fingers.

61. A method for fabricating an integrated circuit die, comprising the steps of:

providing a die comprising bond pads disposed on a first surface in an I-shaped layout; and mounting the die onto a support substrate having an I-shaped opening such that the bond pads are exposed through the I-shaped opening, and a gap is provided between a peripheral edge of the die and the opening of the support substrate.

62. A method for fabricating an integrated circuit die, comprising the steps of:

providing a die comprising bond pads disposed on a first surface in an I-shaped layout; and mounting the die onto a support substrate having an I-shaped opening and a hole through the substrate adjacent the opening such that the bond pads are exposed through the I-shaped opening of the support substrate, and the hole through the support substrate is uncovered.

63. A method for fabricating an integrated circuit die, comprising the steps of:

providing a die comprising bond pads disposed on a first surface in an I-shaped layout; and mounting the die onto a support substrate having an I-shaped opening and a hole through the substrate adjacent the opening such that the bond pads are exposed through the I-shaped opening of the support substrate, the hole through the support substrate is uncovered, and a gap is provided between a peripheral edge of the die and the opening of the support substrate.

64. A method for fabricating an integrated circuit die, comprising the steps of:

providing a die comprising bond pads disposed on a first surface;

providing a support substrate having an I-shaped opening comprising a main elongate segment and a pair of shorter elongate segments positioned perpendicular to and on opposing ends of the main segment, and bond pad fingers disposed on a side of the substrate adjacent to the opening; and mounting the die onto the support substrate to align the bond pads within the I-shaped opening of the support substrate, and provide a gap along a peripheral edge of the die and an edge of at least one of the shorter elongate segments of the opening in the support substrate.

65. The method of claim 64, further comprising: electrically connecting the bond pads through the opening to the bond pad fingers.

66. The method of claim 65, further comprising: encapsulating at least the bond pads, the bond pad fingers, and the sides of the die.

67. A method for fabricating an integrated circuit die, comprising the steps of:

providing a die comprising a first surface with bond pads disposed thereon;

providing a support substrate having an I-shaped opening comprising a main elongate segment and a pair of shorter elongate segments positioned perpendicular to and on opposing ends of the main segment, one or more holes disposed through the support substrate on opposite ends of and adjacent to the shorter elongate segments of the I-shaped opening, and bond pad fingers disposed on the substrate adjacent to the opening; and mounting the die onto the support substrate to align the bond pads within the I-shaped opening of the support substrate such that at least one of the holes through the support substrate are uncovered.

68. The method of claim 67, further comprising: electrically connecting the bond pads to the bond pad fingers.

69. The method of claim 68, further comprising: encapsulating at least the bond pads, the bond pad fingers, and the sides of the die.

70. A method for fabricating an integrated circuit die, comprising the steps of:

providing a die comprising bond pads disposed there on a first surface;

providing a support substrate having an I-shaped opening comprising a main elongate segment and a pair of shorter elongate segments positioned perpendicular to and on opposing ends of the main segment, one or more holes through the support substrate on opposite ends of and adjacent to the shorter elongate segments of the I-shaped opening, and bond pad fingers disposed on the substrate adjacent to the opening, and mounting the die onto the support substrate to align the bond pads within the I-shaped opening of the support substrate such that at least one of the holes through the support substrate are uncovered, and a gap is provided along a peripheral edge of the die and an edge of at least one of the shorter elongate segments of the opening of the support substrate.

71. The method of claim 70, further comprising: electrically connecting the bond pads to the bond pad fingers.

72. The method of claim 71, further comprising: encapsulating at least the bond pads, the bond pad fingers, and the sides of the die.

73. A method of forming an integrated circuit die package, comprising the steps of:

providing a mold containing a die unit; the mold having a molding chamber and a mold gate providing a conduit for introducing a molding compound into the chamber; the die unit comprising a die having a first surface, a second surface, and sides; the first surface of the die comprising a plurality of bond pads disposed thereon, and being mounted onto a support substrate with the bond pads exposed through an opening of the support substrate; the die unit positioned within the mold such that the mold gate is oriented to introduce the molding compound directly into the opening in the support substrate of the die unit, and the mold gate is positioned at about the center of the opening of the support substrate; and introducing a molding compound through the mold gate to flow the molding compound into the opening in the support substrate of the die unit to enclose the bond pads on the die such that the molding compound is flowed onto about the center of the opening of the support substrate and toward each end of the opening.

74. A method for encapsulating an integrated circuit die, comprising the steps of:

providing a mold having a molding chamber and a mold gate providing a conduit for introducing a molding compound into the chamber;

providing a die unit comprising a die having a first surface, a second surface, and sides; the first surface of the die having a plurality of bond pads disposed thereon, the first surface of the die mounted onto a support substrate with the bond pads exposed through an opening of the support substrate;

placing the die unit in the mold with the mold gate oriented to introduce the molding compound directly into the opening in the support substrate the mold gate being positioned at about the center of the opening of the support substrate;

introducing a molding compound through the mold gate whereby the molding compound flows into the opening in the support substrate to enclose the bond pads on the die and that the molding compound is flowed onto about the center of the opening of the support substrate and toward each end of the opening.

* * * * *

UNITED STATES PATENT AND TRADEMARK OFFICE
CERTIFICATE OF CORRECTION

PATENT NO. : 6,692,987 B2
DATED : February 17, 2004
INVENTOR(S) : Thiam Chye Lim et al.

It is certified that error appears in the above-identified patent and that said Letters Patent is hereby corrected as shown below:

Title page,
Item [30], Foreign Application Priority Data, delete the second line:
"Jan. 9, 2002    (SG)    2002-00134-5"

Column 10,
Line 13, replace "54'41" with -- 54'" --.

Signed and Sealed this

Twenty-seventh Day of July, 2004

JON W. DUDAS
*Acting Director of the United States Patent and Trademark Office*